(12) United States Patent
Tsujino et al.

(10) Patent No.: US 6,949,986 B2
(45) Date of Patent: Sep. 27, 2005

(54) SEMICONDUCTOR DEVICE UNLIKELY TO MAKE INCORRECT DETERMINATION OF FUSE BLOW

(75) Inventors: Mitsunori Tsujino, Hyogo (JP); Takeo Miki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 77 days.

(21) Appl. No.: 10/647,385

(22) Filed: Aug. 26, 2003

(65) Prior Publication Data

US 2004/0174204 A1 Sep. 9, 2004

(30) Foreign Application Priority Data

Mar. 3, 2003 (JP) ........................................ 2003-055262

(51) Int. Cl.[7] .............................................. H03H 7/38
(52) U.S. Cl. ..................... 333/124; 365/200; 365/225.7
(58) Field of Search ....................... 333/124; 365/225.7, 365/200

(56) References Cited

U.S. PATENT DOCUMENTS

| | | | | |
|---|---|---|---|---|
| 5,566,107 A | * | 10/1996 | Gilliam | ...................... 365/200 |
| 5,825,698 A | * | 10/1998 | Kim et al. | ................... 365/200 |
| 6,084,803 A | * | 7/2000 | Sredanovic et al. | ... 365/189.05 |
| 6,144,591 A | * | 11/2000 | Vlasenko et al. | ........... 365/200 |
| 6,353,562 B2 | * | 3/2002 | Bohm et al. | ................. 365/200 |
| 6,465,818 B1 | * | 10/2002 | Kato | .......................... 257/207 |

FOREIGN PATENT DOCUMENTS

JP  2001-210093 A  8/2001

* cited by examiner

*Primary Examiner*—Robert Pascal
*Assistant Examiner*—Kimberly Glenn
(74) *Attorney, Agent, or Firm*—McDermott Will & Emery LLP

(57) ABSTRACT

By switching a mode signal, capability of a drive circuit in a latch circuit can be improved than in a normal mode. Accordingly, even if a small leakage occurs in a blown portion of a fuse element, blow is correctly identified. In this manner, by improving drivability of the latch circuit, incorrect determination of fuse blow state can be avoided. Thus, a semiconductor device unlikely to make incorrect determination of fuse blow state can be provided.

10 Claims, 17 Drawing Sheets

SEMICONDUCTOR DEVICE UNLIKELY TO MAKE INCORRECT DETERMINATION OF FUSE BLOW

BACKGROUND OF THE INVENTION

1. Field of the Invention

The present invention relates to a semiconductor device, and more particularly to a semiconductor device having a fuse element used for instructing replacement of a defective memory cell with a spare cell, for example, in a dynamic random access memory (DRAM) of a large capacity.

2. Description of the Background Art

In a DRAM of a large capacity, it is extremely difficult to attain non-defectiveness in all memory cells. Therefore, generally, a redundant configuration, in which spare memory cells are provided in a memory cell array for replacing a defective portion, is adopted.

Japanese Patent Laying-Open No. 2001-210093 discloses a repair signal generating circuit used in a laser trimming scheme, in which a fuse unit corresponding to an address of a defective portion is blown with a laser beam to disconnect a circuit in the defective portion, and instead, a spare portion is operated.

In some cases, fuse blow by the laser beam is not completely achieved, which will cause a problem. That is, an internal circuit may determine that the fuse has not been blown, and an operation for replacement with the spare portion is not performed. Alternatively, a memory cell corresponding to a completely irrelevant address may be replaced.

A chip in which fuse blow has been incomplete and a current larger than a certain value flows exhibits malfunction always in a stable manner. Therefore, the chip can easily be removed in a test before shipping. On the other hand, if a small, remaining portion is present in a blown portion, an unstable operation may be exhibited, because the fuse is sometimes determined as blown and sometimes not blown, affected by complex operational factors such as operation timing, or operation temperature. It is difficult to remove the chip operating in such an unstable manner, and test conditions have had to be considered well.

Further, manufacturing yield has been lowered because of an error in replacement due to the presence of the small remaining portion.

SUMMARY OF THE INVENTION

An object of the present invention is to provide a semiconductor device unlikely to make incorrect determination of fuse blow state.

In summary, according to the present invention, a semiconductor device includes a first connection circuit, a first fuse element, and a first latch circuit. The first connection circuit connects a first internal node to a first power supply node provided with a first power supply potential in response to a first control signal. The first fuse element is provided on a path between a second power supply node provided with a second power supply potential which is different from the first power supply potential and the first internal node, and stores a conductive state in a non-volatile manner. The first latch circuit holds a logic value corresponding to a potential of the first internal node. The first latch circuit includes a first inverting circuit having an input connected to the first internal node, and a first driver circuit driving the first internal node to the first power supply potential in accordance with an output of the first inverting circuit. The first driver circuit has a drivability variable in accordance with a second control signal.

According to another aspect of the present invention, a semiconductor device includes a first connection circuit, a first latch circuit, a first fuse element, and a second connection circuit. The first connection circuit connects a first internal node to a first power supply node provided with a first power supply potential in response to a first control signal. The first latch circuit holds a logic value corresponding to a potential of the first internal node. The first fuse element is provided on a path between a second power supply node provided with a second power supply potential which is different from the first power supply potential and the first internal node, and stores a conductive state in a non-volatile manner. The second connection circuit is provided in series with the first fuse element between the first internal node and the second power supply node, and has a resistance value variable in accordance with a second control signal.

According to yet another aspect of the present invention, a semiconductor device includes a latch circuit, a fuse element, a connection circuit, and a pulse generating circuit. The latch circuit holds a logic value corresponding to a potential of an input node which is initially set to a first power supply potential. The fuse element is provided on a path between a power supply node provided with a second power supply potential which is different from the first power supply potential and an internal node, and stores a conductive state in a non-volatile manner. The connection circuit connects the internal node to the input node during a period designated by a window pulse. The pulse generating circuit varies a pulse width of the window pulse in response to a control signal.

A primary advantage of the present invention is that a degree of severity in determining fuse blow state when a fuse element is incompletely blown can be adjusted. Therefore, even if a leakage current flows in a blown portion of the fuse element, incorrect determination of a blow state can be avoided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
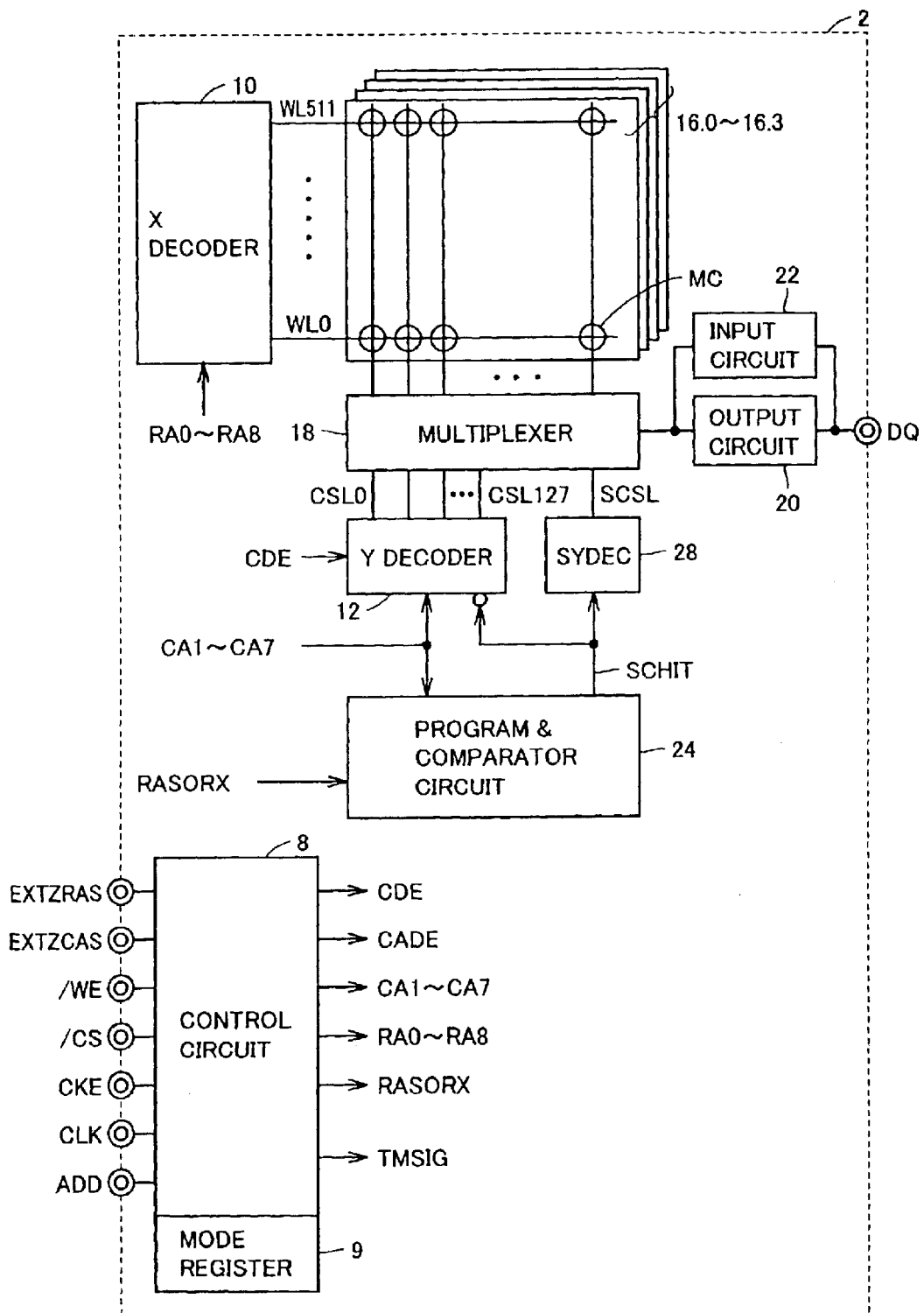
FIG. 1 is a schematic block diagram showing a configuration of a semiconductor device 2 according to the present invention.

In the following, embodiments of the present invention will be described in detail with reference to the figures. It is noted that the same reference characters refer to the same or corresponding components in the figures.

(Embodiment 1)

FIG. 1 is a schematic block diagram showing a configuration of a semiconductor device 2 according to the present invention. In the present specification, a semiconductor memory device having a memory array will be described as an example of the semiconductor device according to the present invention.

Referring to FIG. 1, semiconductor device 2 includes memory blocks 16.0 to 16.3 having a plurality of memory cells MC arranged in matrix. Memory blocks 16.0 to 16.3 represent four-part split regions of the memory cell array. A prescribed 2 bits of the order higher than RA0–RA8 among row addresses select one of the memory blocks.

For the sake of simplicity, a configuration is shown in FIG. 1, in which one spare memory cell column for improving yield is included in each of memory blocks 16.0 to 16.3 in addition to normal memory cells arranged in 512 rows and 128 columns. Actually, however, normal memory cells are arranged in larger number of rows and columns, and in many cases, a plurality of spare memory cell columns are provided. In addition, though one input/output terminal is shown in FIG. 1, either 4, 8, or 16 input/output terminals are actually provided. A configuration as illustrated is provided for each input/output terminal.

Semiconductor device 2 further includes a control circuit 8 receiving an address signal ADD, a clock signal CLK, and control signals EXTZRAS, EXTZCAS, /WE, /CS, CKE, and outputting internal control signals CDE, CADE, column addresses CA0–CA7, row addresses RA0–RA8, a signal RASORX, and a mode signal TMSIG. Control circuit 8 includes a mode register 9 holding an operation mode of semiconductor device 2. Here, "Z" and "/" added to signal names indicate inversion.

Each of memory blocks 16.0 to 16.3 includes memory cells MC arranged in matrix, word lines WL0 to WL511 provided corresponding to rows of memory cells MC, and column line pairs CSL0 to CSL127 provided corresponding to columns of memory cells MC.

Semiconductor device 2 further includes an X decoder 10 decoding row address signals RA0 to RA8 provided from control circuit 8 and selectively driving word lines WL0 to WL511. X decoder 10 includes a not-shown word driver for driving a row (a word line) addressed internally in memory blocks 16.0 to 16.3 to a selected state.

Semiconductor device 2 further includes a program & comparator circuit 24 outputting a signal SCHIT indicating whether or not a spare memory cell row is to be selected in accordance with signal RASORX activated in response to input of an address signal and column addresses CA1–CA7, a Y decoder 12 activated in response to control signal CDE and signal SCHIT to decode column addresses CA0–CA7 and to select any of column select lines CSL0 to CSL127, and a spare Y decoder 28 selecting a spare column select line SCSL in response to signal SCHIT.

Semiconductor device 2 further includes a multiplexer 18 selecting a bit line pair designated by column select lines CSL0 to CSL127 and spare column select line SCSL for providing/receiving data to/from the outside, an input circuit 22 receiving a signal DQ provided from a terminal and transmitting the same to multiplexer 18, and an output circuit 20 outputting data read via multiplexer 18 from memory blocks 16.0 to 16.3 to the terminal as signal DQ.

An outline of an operation will now be described.

If a defective memory cell is accessed among normal memory cells, a spare memory cell will be accessed instead of the defective memory cell.

X decoder 10 selects one of 512 rows in response to a 9-bit address signal. Y decoder 12 selects one of 127 columns in response to a 7-bit address signal CA1–CA7. An address of a defective column is programmed in program & comparator circuit 24, which compares the input address signal with the programmed address of the defective column. When the input address signal matches with the address of the defective column, signal SCHIT attains H level, the operation of Y decoder 12 is prohibited, and spare Y decoder 28 activates spare column select line SCSL.

On the other hand, when the input address signal does not match with the address of the defective column, Y decoder 12 selects a column in accordance with address signal CA0–CA7. Here, the operation of spare Y decoder 28 is prohibited.

Figure 2:
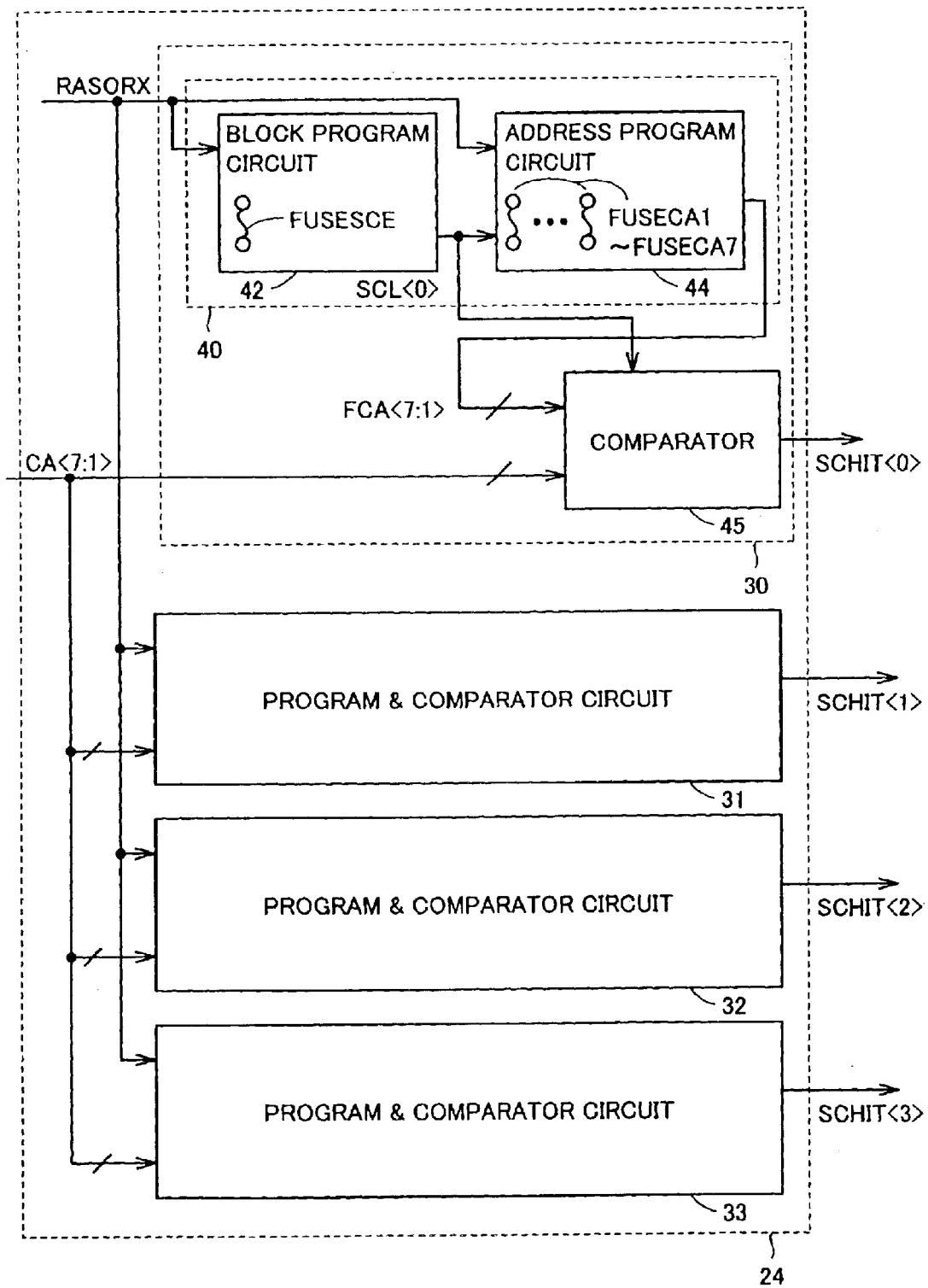
FIG. 2 is a block diagram showing a configuration of a program & comparator circuit in FIG. 1.

FIG. 2 is a block diagram showing a configuration of the program & comparator circuit in FIG. 1.

Referring to FIG. 2, program & comparator circuit 24 includes program & comparator circuits 30 to 33. Program & comparator circuits 30 to 33 are provided corresponding to memory blocks 16.0 to 16.3 in FIG. 1, respectively.

Program & comparator circuits 30 includes a program unit 40 and a comparator 45. Program unit 40 reads contained setting information for the fuse as a signal FCA<7:1> in response to signal RASORX. Signal RASORX is activated by recognizing an ACT command instructing row activation and the input address, and activation is maintained for a time period from input of command ACT until input of a command PRE (precharge).

Program unit 40 includes a block program circuit 42 including a fuse element FUSESCE which is blown when a spare column is used in a corresponding memory block and outputting a block select signal SCL<0>, and an address program circuit 44 including fuse elements FUSECA1 to FUSECA7 for designating an address of a defective column to be replaced with the spare column and outputting address signal FCA<7:1> corresponding to the defective column.

Comparator 45 compares address signal FCA<7:1> corresponding to the defective column with an input column address signal CA<7:1> for each bit, and activates signal SCHIT<0> for selecting the spare column if the addresses match with each other.

Program & comparator circuits 31 to 33 are different from program & comparator circuit 30 in that they output signals SCHIT<1> to SCHIT<3> corresponding to memory blocks 16.1 to 16.3 respectively. An internal configuration of program & comparator circuits 31 to 33, however, is similar to that of program & comparator circuit 30. Therefore, description thereof will not be repeated.

Figure 3:
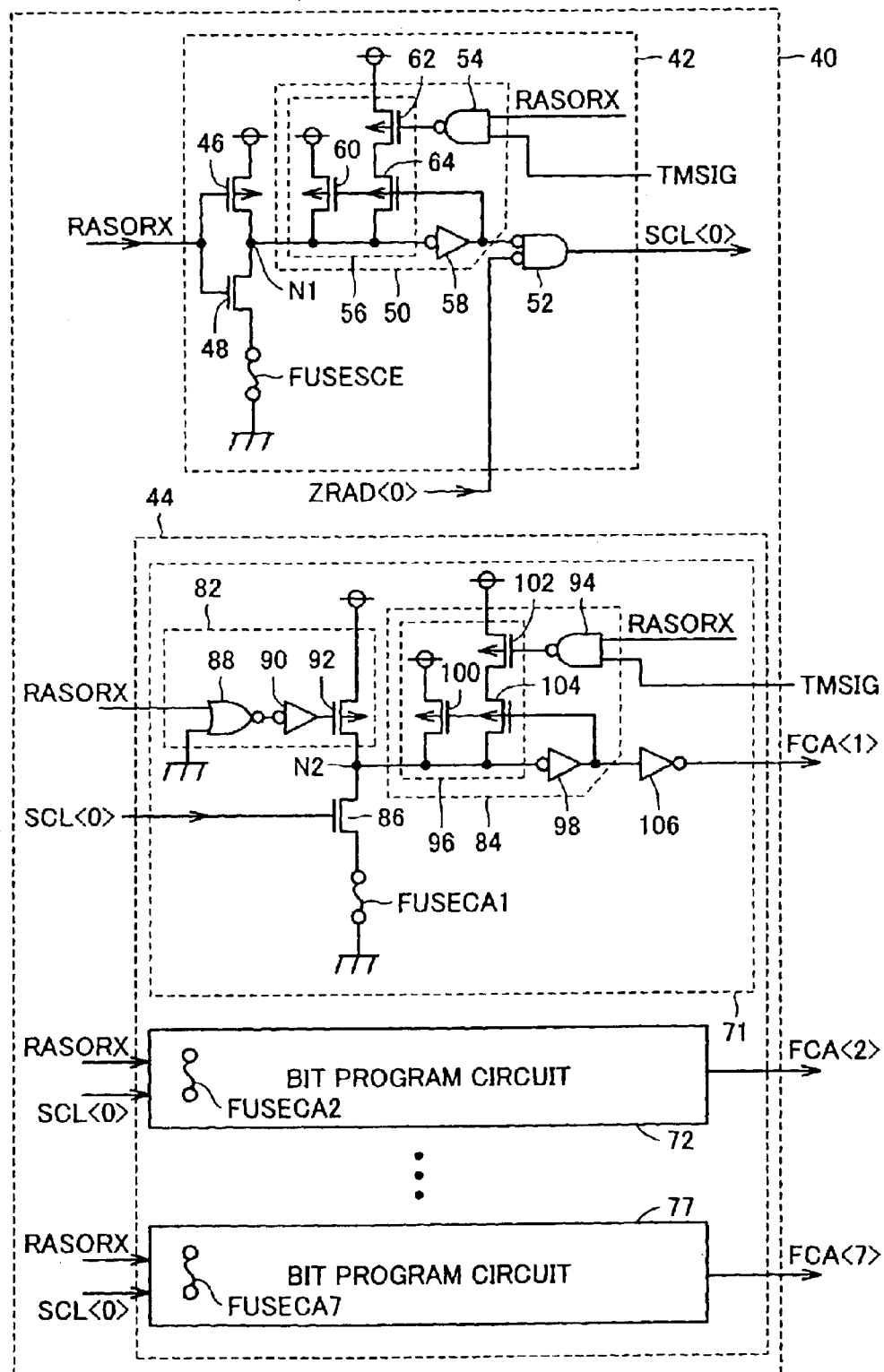
FIG. 3 is a circuit diagram showing a configuration of a program unit in FIG. 2.

FIG. 3 is a circuit diagram showing a configuration of the program unit in FIG. 2.

Referring to FIG. 3, program unit 40 includes block program circuit 42 including fuse element FUSESCE which is blown when the spare column is used in the corresponding memory block and outputting block select signal SCL<0>, and address program circuit 44 including fuse elements FUSECA1 to FUSECA7 for designating the address of the defective column to be replaced with the spare column and outputting address signals FCA<1> to <7> corresponding to the defective column.

Block program circuit 42 includes a P-channel MOS transistor 46 connected between a power supply node and a node N1 and receiving signal RASORX at its gate, fuse element FUSESCE having one end connected to a ground node, and an N-channel MOS transistor 48 connected between the other end of fuse element FUSESCE and node N1 and receiving signal RASORX at its gate.

Block program circuit 42 further includes a latch circuit 50 latching information corresponding to a potential of node N1, and an NOR circuit 52 receiving an output of latch circuit 50 and a signal ZRAD<0>, and outputting signal SCL<0>.

Latch circuit 50 includes an inverter 58 having an input connected to node N1, a drive circuit 56 driving node N1 to the power supply potential in accordance with an output of inverter 58, and an NAND circuit 54 receiving signal RASORX and mode signal TMSIG. An output of NAND circuit 54 varies drivability of drive circuit 56.

Drive circuit 56 includes a P-channel MOS transistor 60 connected between the power supply node and node N1 and receiving the output of inverter 58 at its gate, and P-channel MOS transistors 62, 64 connected in series between the power supply node and node N1. P-channel MOS transistors 62, 64 receive the output of NAND circuit 54 and the output of inverter 58 at their gates respectively.

Address program circuit 44 includes bit program circuits 71 to 77. Bit program circuits 71 to 77 include fuse elements FUSECA1 to FUSECA7 respectively. Fuse elements FUSECA1 to FUSECA7 correspond to address bits CA1 to CA7 respectively.

Bit program circuit 71 includes a connection circuit 82 connecting a node N2 to the power supply node in response to signal RASORX, fuse element FUSECA1 having one end connected to the ground node, and an N-channel MOS transistor 86 connected between the other end of fuse element FUSECA1 and node N2 and receiving signal SCL<0> at its gate.

Connection circuit 82 includes an NOR circuit 88 having one input fixed to L level and receiving signal RASORX at the other input, an inverter 90 receiving and inverting an output of NOR circuit 88, and a P-channel MOS transistor 92 connected between the power supply node and node N2 and receiving an output of inverter 90 at its gate.

Bit program circuit 71 further includes a latch circuit 84 latching information corresponding to the potential of node N2, and an inverter 106 receiving and inverting an output of latch circuit 84 and outputting signal FCA<1>.

Latch circuit 84 includes an inverter 98 having an input connected to node N2, a drive circuit 96 driving node N2 to the power supply potential in accordance with an output of inverter 98, and an NAND circuit 94 receiving signal RASORX and mode signal TMSIG. An output of NAND circuit 94 varies drivability of drive circuit 96.

Drive circuit 96 includes a P-channel MOS transistor 100 connected between the power supply node and node N2 and receiving the output of inverter 98 at its gate, and P-channel MOS transistors 102, 104 connected in series between the power supply node and node N2. P-channel MOS transistors 102, 104 receive the output of NAND circuit 94 and the output of inverter 98 at their gates respectively.

Bit program circuits 72 to 77 are different from bit program circuit 71 in that they include FUSECA2 to FUSECA7 instead of FUSECA1 respectively, and output corresponding signals FCA<2> to FCA<7> respectively. An internal configuration of bit program circuits 72 to 77, however, is otherwise the same as that of bit program circuit 71. Therefore, description thereof will not be repeated.

An operation will briefly be described. When a redundant circuit is used in the corresponding memory block, fuse element FUSESCE is blown. The fuse element is blown with a laser beam, for example. In addition, some of fuse elements FUSECA1 to FUSECA7 are blown, corresponding to the address to be replaced. If a corresponding bit of the address to be replaced is at "H" level, the fuse element will be blown.

When fuse element FUSESCE is blown, node N1 is latched to H level by latch circuit 50. As a result, signal SCL<0> attains H level. Then, in bit program circuit 71, N-channel MOS transistor 86 is rendered conductive, and whether or not fuse element FUSECA1 has been blown is read into latch circuit 84. Signal FCA<1> is output in accordance with a result of latching by latch circuit 84.

A blown state of the fuse element is detected in a similar manner also in other bit program circuits 72 to 77, and signals FCA<2> to FCA<7> are output.

Figure 4:
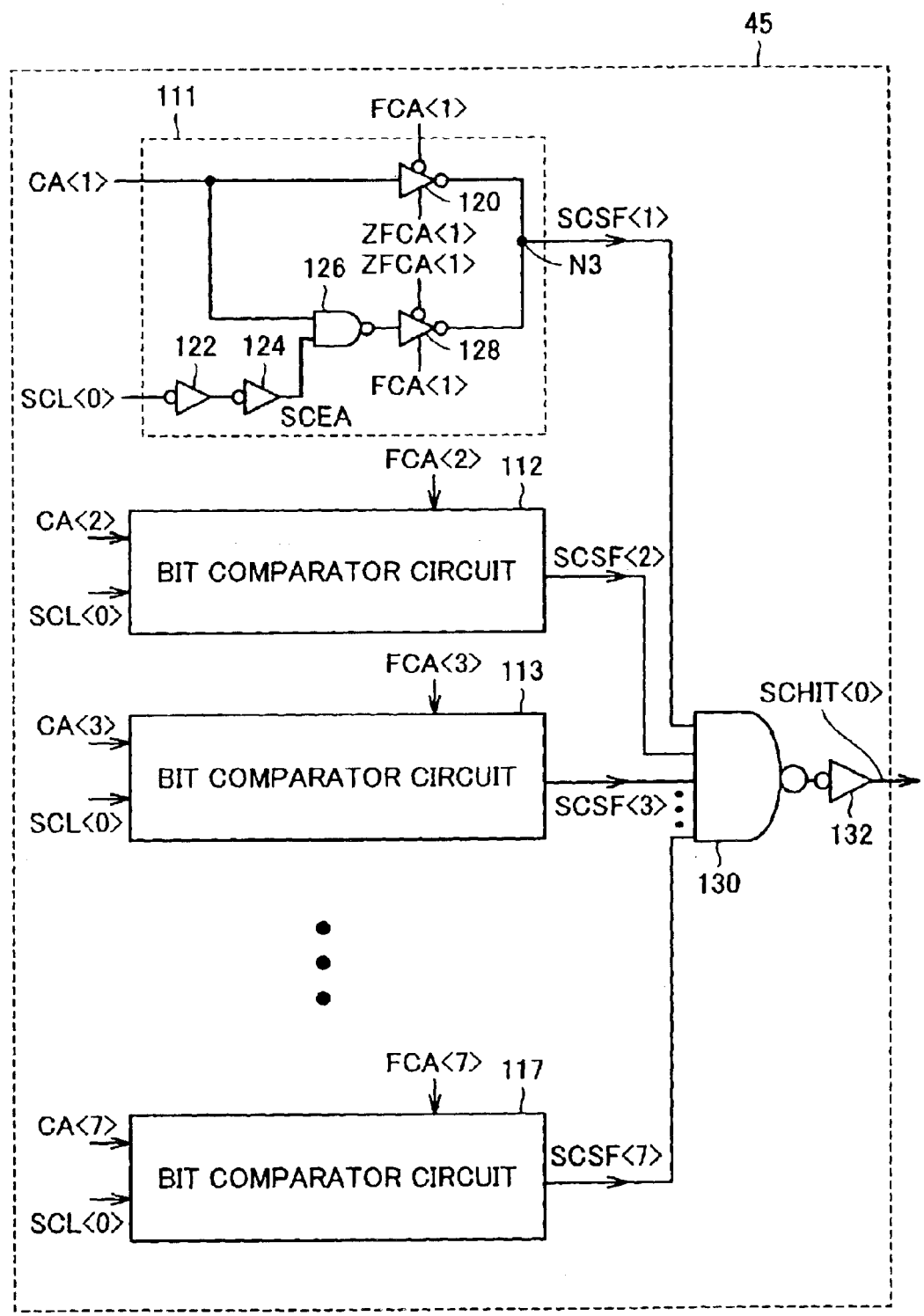
FIG. 4 is a circuit diagram showing a configuration of a comparator in FIG. 2.

FIG. 4 is a circuit diagram showing a configuration of the comparator in FIG. 2.

Referring to FIG. 4, comparator 45 includes bit comparator circuits 111 to 117 corresponding to address signals CA<1> to CA<7> respectively, a 7-input NAND circuit 130 receiving outputs of bit comparator circuits 111 to 117, and an inverter 132 receiving and inverting an output of NAND circuit 130 and outputting signal SCHIT<0>.

Bit comparator circuit 111 includes an inverter 122 receiving and inverting signal SCL<0>, an inverter 124 receiving and inverting an output of inverter 122 and outputting a signal SCEA, an NAND circuit 126 receiving signal SCEA and address signal CA<1>, a clocked inverter 128 activated when signal FCA<1> attains H level, receiving and inverting an output of NAND circuit 126, and outputting a signal SCSF<1>, and a clocked inverter 120 activated when signal FCA<1> attains L level, receiving and inverting address signal CA<1>, and outputting signal SCSF<1>.

As bit comparator circuits 112 to 117 are configured in a manner similar to bit comparator circuit 111, description thereof will not be repeated.

An operation of bit comparator circuit 111 will briefly be described.

When the spare memory cell column in a block 0 is not used, that is, when signal SCL<0> is at L level, signal SCEA attains L level, and the output of NAND circuit 126 attains H level.

Here, N-channel MOS transistor 86 in FIG. 3 maintains a non-conductive state. Therefore, whether or not the fuse element has been blown, signals FCA<1> to FCA<7> all attain H level.

In bit comparator circuit 111, clocked inverter 120 is inactivated, while clocked inverter 128 is activated. Clocked inverter 128 inverts H level of the output of NAND circuit 126, and signal SCSF<1> attains L level.

As signals SCSF<2> to SCSF<7> also attain L level, NAND circuit 130 outputs H level, and consequently, signal SCHIT<0> attains L level. Therefore, a replacement operation in memory block 16.0 is not performed.

Next, when the spare memory cell column in block 0 is used, that is, when signal SCL<0> is at H level, signal SCEA attains H level, and the output of NAND circuit 126 attains an inverted value of signal CA<1>.

Here, N-channel MOS transistor 86 in FIG. 3 is rendered conductive. Therefore, if the fuse element has been blown, signal FCA<1> attains H level. On the other hand, if the fuse element has not been blown, signal FCA<1> attains L level. If a corresponding bit of the defective address is at "1", the fuse is blown. Accordingly, signal FCA<1> attains H level if corresponding bit CA of the defective address is at "1", while attains L level if that corresponding bit is at "0".

If the corresponding bit of the defective address is at "1" and signal FCA<1> attains H level, clocked inverter 128 is activated. Then, if signal CA<1> attains H level, signal SCSF<1> attains H level. On the other hand, if signal CA<1> attains L level, signal SCSF<1> attains L level. In other words, when signal CA<1> matches with the corresponding bit "1" of the defective address, signal SCSF<1> attains H level. Otherwise, signal SCSF<1> attains L level.

In contrast, if the corresponding bit of the defective address is at "0" and signal FCA<1> attains L level, clocked inverter 120 is activated. Then, if signal CA<1> attains H level, signal SCSF<1> attains L level. On the other hand, if signal CA<1> attains L level, signal SCSF<1> attains H level. In other words, when signal CA<1> matches with the corresponding bit "0" of the defective address, signal SCSF<1> attains H level. Otherwise, signal SCSF<1> attains L level.

Similarly, also in bit comparator circuits 112 to 117, the corresponding bit of the input address is compared with the corresponding bit of the defective address, and signals SCSF<2> to SCSF<7> are output.

When all the input address bits match with the defective address bits, signal SCHIT<0> is activated to H level by NAND circuit 130 and inverter 132, and the defective column is replaced with the spare column.

Figure 5:
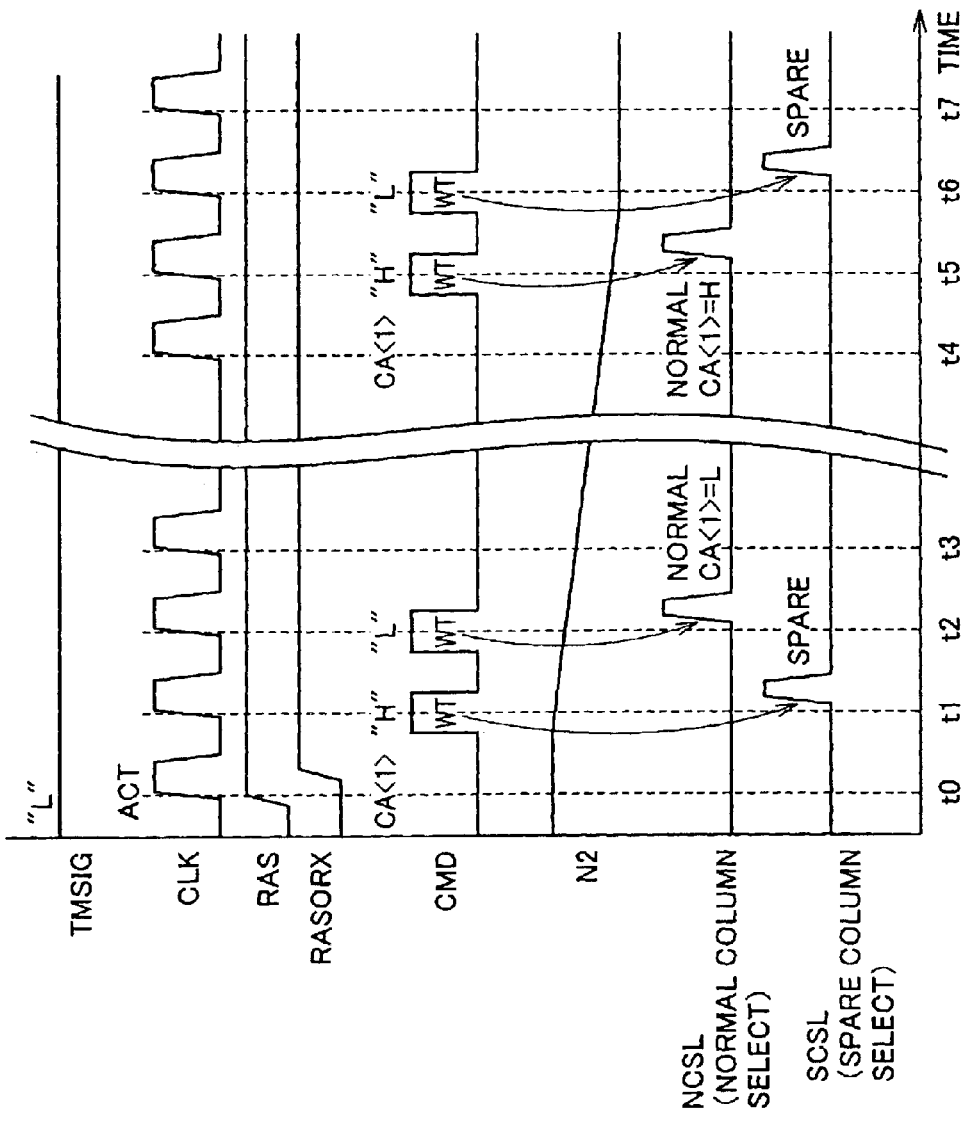
FIG. 5 is an operational waveform diagram illustrating an operation for detecting blow of a fuse corresponding to CA1–CA7 in a normal operation mode of the semiconductor device according to the present invention.

FIG. 5 is an operational waveform diagram illustrating an operation for detecting blow of a fuse corresponding to CA1–CA7 in a normal operation mode of the semiconductor device according to the present invention.

Referring to FIGS. 3 and 5, at time t0, command ACT is input, and a row is activated. In the normal operation mode, mode signal TMSIG is set to L level. Though fuse element FUSECA1 has been blown by the laser beam, it is assumed that blow is incomplete, and that a small remaining portion exists.

For example, it is assumed that a write command WT is input at time t1, and that column address signal CA<1> attains H level at this time. If the fuse has been blown, node N2 in FIG. 3 is maintained at H level, and signal FCA<1> also attains H level. As signal CA<1> matches with signal FCA<1>, spare column select line SCSL is activated so that the spare column is selected if all other bits match.

In addition, it is assumed that write command WT is input as shown at time t2 and later, and that column address signal CA<1> is at L level at this time. If the fuse has been blown, node N2 in FIG. 3 is maintained at H level, and signal FCA<1> attains H level. As signal CA<1> does not match with signal FCA<1>, the spare column is not selected, but a normal column select line NCSL is activated.

Meanwhile, though a minimum value for a time period tRCD from activation of the row by command ACT until input of write command WT is defined, a maximum value thereof is not defined. Therefore, write command WT is not always input at the same timing. Accordingly, in some cases, a read operation or a write operation with long time period tRCD may be performed.

If the fuse has been blown, node N2 in FIG. 3 should be maintained at H level. If the blow of the fuse element is incomplete, however, the potential of node N2 is lowered. Charges of parasitic capacitance at node N2 once precharged by precharge transistor 92 gradually leak toward the ground potential, and the potential of node N2 will attain a voltage-divided potential, which is determined by a ratio of a conductive resistance of P-channel MOS transistor 100 to a combined resistance of N-channel MOS transistor 86 and a remaining portion of fuse element FUSECA1.

When the potential of node N2 is lower than a threshold voltage of inverter 98, the output of inverter 98 is inverted, and P-channel MOS transistor 100 enters an "off" state. The potential of node N2 finally attains the ground potential by N-channel MOS transistor 86 and the remaining portion of fuse element FUSECA1. Here, signal FCA<1> that should be at H level is set to L level.

At time t5, a state is shown, in which input column address signal CA<1> attains H level when the writing operation with long time period tRCD is performed. Signal FCA<1> indicating a defective address bit that should essentially be at H level has been set to L level. As signal CA<1> does not match with signal FCA<1>, the spare column is not selected, and normal column select line NCSL is activated.

In addition, at time t6, a state is shown, in which input column address signal CA<1> attains L level when the writing operation with long time period tRCD is performed. Signal FCA<1> indicating the defective address bit that should essentially be at H level has been set to L level. As signal CA<1> matches with signal FCA<1>, spare column select line SCSL is activated so that the spare column is selected if all other bits match.

Figure 6:
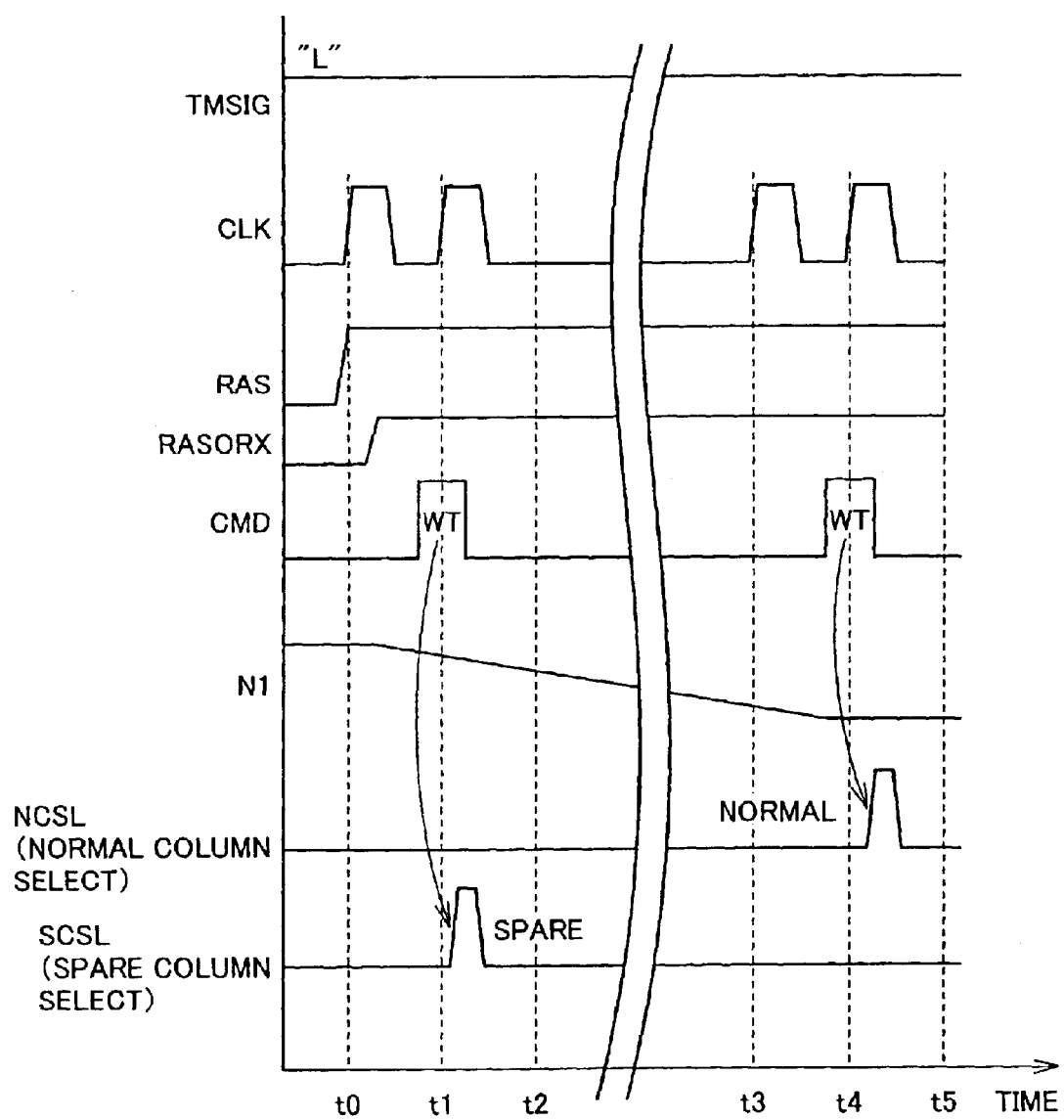
FIG. 6 is an operational waveform diagram illustrating an operation for detecting blow of a fuse corresponding to block selection in the normal operation mode of the semiconductor device according to the present invention.

FIG. 6 is an operational waveform diagram illustrating an operation for detecting blow of a fuse corresponding to block selection in the normal operation mode of the semiconductor device according to the present invention.

Referring to FIGS. 3 and 6, at time t0, command ACT is input, and a row is activated. In the normal operation mode, mode signal TMSIG is set to L level. Though fuse element FUSESCE has been blown by the laser beam, it is assumed that blow is incomplete, and that small remaining portion exists.

For example, it is assumed that write command WT is input at time t1. If the fuse has been blown, node N1 in FIG. 3 is maintained at H level, and signal SCL<0> also attains H level, on the premise that signal ZRAD<0> is at L level. Here, spare column select line SCSL is activated so that the spare column is selected if signals CA<1> to CA<7> match with signals FCA<1> to FCA<7> respectively.

Meanwhile, though a minimum value for a time period tRCD from activation of the row by command ACT until input of write command WT is defined, a maximum value thereof is not defined. Therefore, write command WT is not always input at the same timing. Accordingly, in some cases, a read operation or a write operation with long time period tRCD may be performed.

If the fuse has been blown, node N1 in FIG. 3 should be maintained at H level. If the blow of the fuse element is incomplete, however, the potential of node N1 is lowered. Charges of parasitic capacitance at node N1 once precharged by precharge transistor 46 gradually leak toward the ground potential, and the potential of node N1 will attain a voltage-divided potential, which is determined by a ratio of a conductive resistance of P-channel MOS transistor 60 to a combined resistance of N-channel MOS transistor 48 and a remaining portion of fuse element FUSESCE.

When the potential of node N1 is lower than a threshold voltage of inverter 58, the output of inverter 58 is inverted, and P-channel MOS transistor 60 enters the "off" state. The potential of node N1 finally attains the ground potential by N-channel MOS transistor 48 and the remaining portion of fuse element FUSESCE. Here, signal SCL<0> that should attain H level is set to L level.

At time t4, a state is shown, in which the writing operation with long time period tRCD is performed. When write command WT is input at time t4, signal SCL<0> that should essentially attain H level is set to L level. When signal SCL<0> is at L level, the state of the fuse element is not read in bit program circuits 71 to 77 in FIG. 3, and signals FCA<1> to FCA<7> all attain H level.

Then, when signal SCL<0> is at L level and signals FCA<1> to FCA<7> all attain H level, consequently, comparator 45 in FIG. 4 sets signal SCHIT<0> to L level. Therefore, the spare column is not selected, but normal column select line NCSL is activated.

Figure 7:
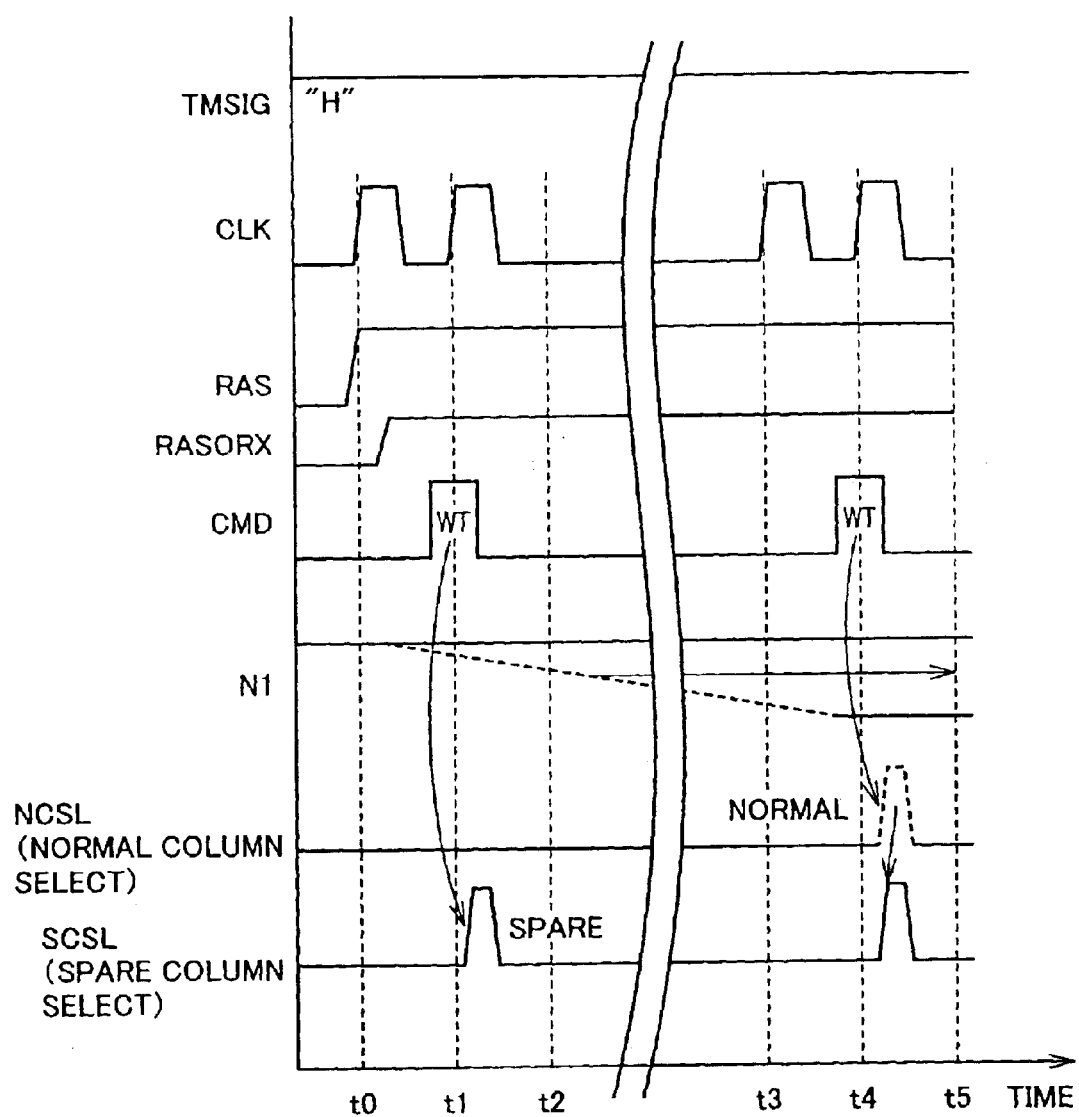
FIG. 7 is an operational waveform diagram illustrating an operation for detecting blow of a fuse corresponding to block selection in a repair mode of the semiconductor device according to the present invention.

FIG. 7 is an operational waveform diagram illustrating an operation for detecting blow of a fuse corresponding to block selection in a repair mode of the semiconductor device according to the present invention.

Referring to FIGS. 3 and 7, at time t0, command ACT is input, and a row is activated. In the repair mode, mode signal TMSIG has been set to H level. Though fuse element FUSESCE has been blown by the laser beam, it is assumed that blow is incomplete, and that small remaining portion exists.

For example, it is assumed that write command WT is input at time t1. If the fuse has been blown, node N1 in FIG. 3 is maintained at H level, and signal SCL<0> also attains H level, on the premise that signal ZRAD<0> is at L level. Here, spare column select line SCSL is activated so that the spare column is selected if signals CA<1> to CA<7> match with signals FCA<1> to FCA<7> respectively.

An example in which the writing operation with long time period tRCD is performed will be described with reference to time t3 and later.

If the fuse has been blown, node N1 in FIG. 3 should be maintained at H level. In FIG. 6, an example has been described, in which, when the blow of the fuse element is incomplete, the potential of node N1 is lowered, and signal SCE<0> attains L level. In contrast, in the repair mode, signal TMSIG has been set to H level.

The charges of parasitic capacitance at node N1 once precharged by precharge transistor 46 gradually leak toward the ground potential, and the potential of node N1 will attain the voltage-divided potential. On the other hand, when P-channel MOS transistors 62, 64 are rendered conductive, the voltage-divided potential can attain a sufficiently high value, compared to the threshold voltage of inverter 58. As the output of inverter 58 is not inverted, signal SCL<0> maintains H level, without being inverted to L level.

Therefore, even if write command WT is input at time t4, signal SCL<0> maintains H level. A replacement circuit that has exhibited malfunction as shown with a dashed line due to a small leakage at the blown portion in the normal operation mode achieves a normal operation as shown with a solid line, and the spare column is selected at time t4.

Here, by switching mode signal TMSIG, the operation for detecting blow of the fuses corresponding to CA1 to CA7 described with reference to FIG. 5 is performed in a manner similar to that for detecting blow of the fuse corresponding to block selection. In other words, by switching mode signal TMSIG, drivability of the latch circuit is improved, and fuse blow can correctly be determined even if a small leakage takes place in the fuse blow portion. Thus, the defect can be removed or identified by improving drivability of the latch circuit.

In the description above, mode signal TMSIG is provided from control circuit 8 based on a setting of mode register 9 in FIG. 1. Alternatively, mode signal TMSIG may be modified by blowing the fuse element. In doing so, a chip determined as defective can be repaired later without exchanging a mask, when the yield is poor.

Figure 8:
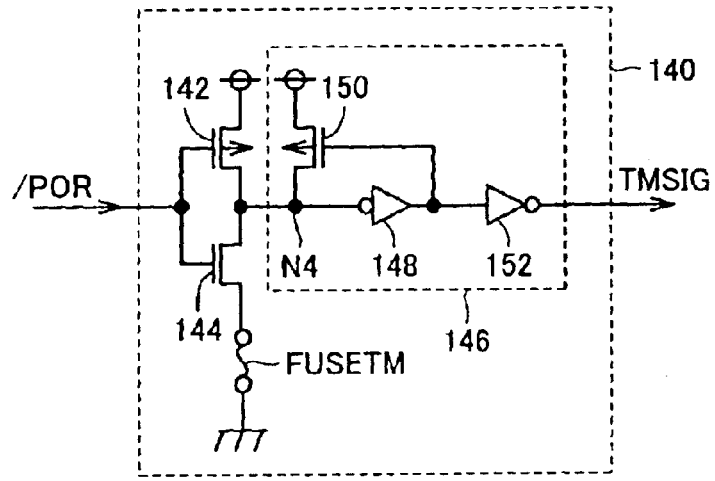
FIG. 8 is a circuit diagram showing a configuration of a mode signal generating circuit modifying a mode signal TMSIG in response to fuse blow.

FIG. 8 is a circuit diagram showing a configuration of a mode signal generating circuit modifying mode signal TMSIG in response to fuse blow.

Referring to FIG. 8, a mode signal generating circuit 140 includes a P-channel MOS transistor 142 connected between the power supply node and a node N4 and receiving a signal /POR at its gate, a fuse element FUSETM having one end connected to the ground node, and an N-channel MOS transistor 144 connected between the other end of fuse element FUSETM and node N4 and receiving signal /POR at its gate.

Mode signal generating circuit 140 further includes a latch circuit 146 latching information corresponding to the potential of node N4.

Latch circuit 146 includes an inverter 148 having an input connected to node N4, a P-channel MOS transistor 150 connected between node N4 and the power supply node and receiving an output of inverter 148 at its gate, and an inverter 152 receiving and inverting the output of inverter 148 and outputting mode signal TMSIG.

A not-shown power-on-reset circuit holds signal /POR at L level for some time when the semiconductor device is powered on, and subsequently cancels reset by raising the signal to H level.

If fuse element FUSETM has not been blown, node N4 attains L level after the reset is cancelled, and signal TMSIG also attains L level.

On the other hand, if fuse element FUSETM has been blown, node N4 attains H level after the reset is cancelled, and signal TMSIG also attains H level.

Providing a circuit as shown in FIG. 8 will allow repairing the chip at a later time if the yield is poor.

In Embodiment 1 described above, by setting to a prescribed mode, capability of the driver in the latch circuit can be improved than in the normal operation mode, and resistance determined for fuse blow can be lowered. Thus, it becomes possible to check whether or not incorrect determination of the fuse blow state is avoided if capability of the driver in the latch circuit is improved in the repair mode. In addition, the chip in which the fuse blow state has incorrectly been determined can be repaired at a later time.

(Embodiment 2)

In Embodiment 1, an example has been described, in which drivability is improved by providing an additional P-channel MOS transistor in a feedback loop within the latch circuit latching the state of the fuse element in a test. Two P-channel MOS transistors in the feedback loop within the latch circuit may be switched for use.

Figure 9:
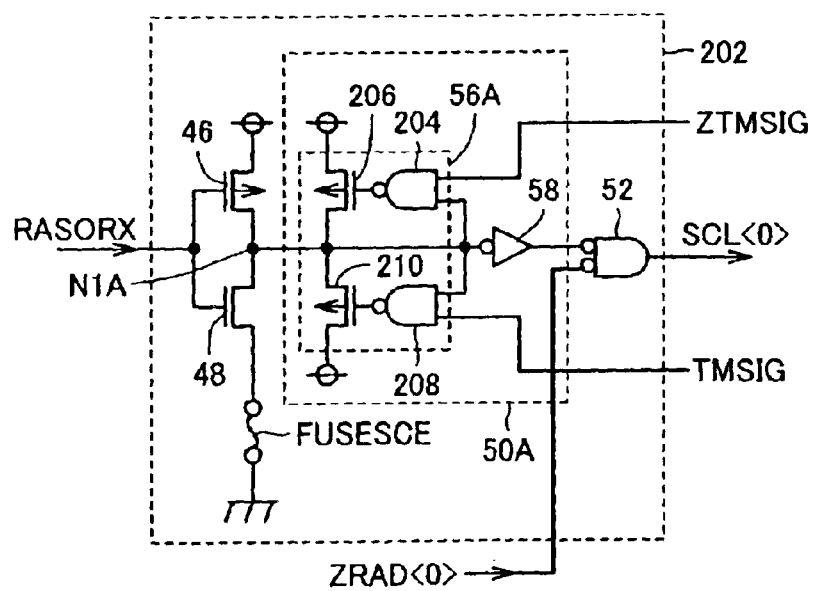
FIG. 9 is a circuit diagram showing another example of a block program circuit.

FIG. 9 is a circuit diagram showing another example of a block program circuit.

Referring to FIG. 9, a block program circuit 202 includes a latch circuit 50 A instead of latch circuit 50 in the configuration of block program circuit 42 shown in FIG. 3. Latch circuit 50A has a node N1A as an input node, and includes a drive circuit 56A instead of drive circuit 56 in the configuration of latch circuit 50 shown in FIG. 3. Since the configuration of block program circuit 202 is otherwise the same as that of block program circuit 42 shown in FIG. 3, description thereof will not be repeated.

Drive circuit 56A includes an NAND circuit 204 having one input connected to node N1A and receiving a signal ZTMSIG at the other input, a P-channel MOS transistor 206 connected between the power supply node and node N1A and receiving an output of NAND circuit 204 at its gate, an NAND circuit 208 having one input connected to node NIA and receiving mode signal TMSIG at the other input, and a P-channel MOS transistor 210 connected between the power supply node and node N1A and receiving an output of NAND circuit 208 at its gate.

Signal ZTMSIG has an inverted value of mode signal TMSIG, and is set to H level in the normal operation mode. Therefore, in drive circuit 56A, P-channel MOS transistor 206 drives node N1A to the power supply potential in the normal operation mode, while P-channel MOS transistor 210 drives node N1A to the power supply potential in the repair mode.

If P-channel MOS transistor 210 is designed to have drivability higher than P-channel MOS transistor 206, incorrect determination of the fuse state in the repair mode can be avoided.

Figure 10:
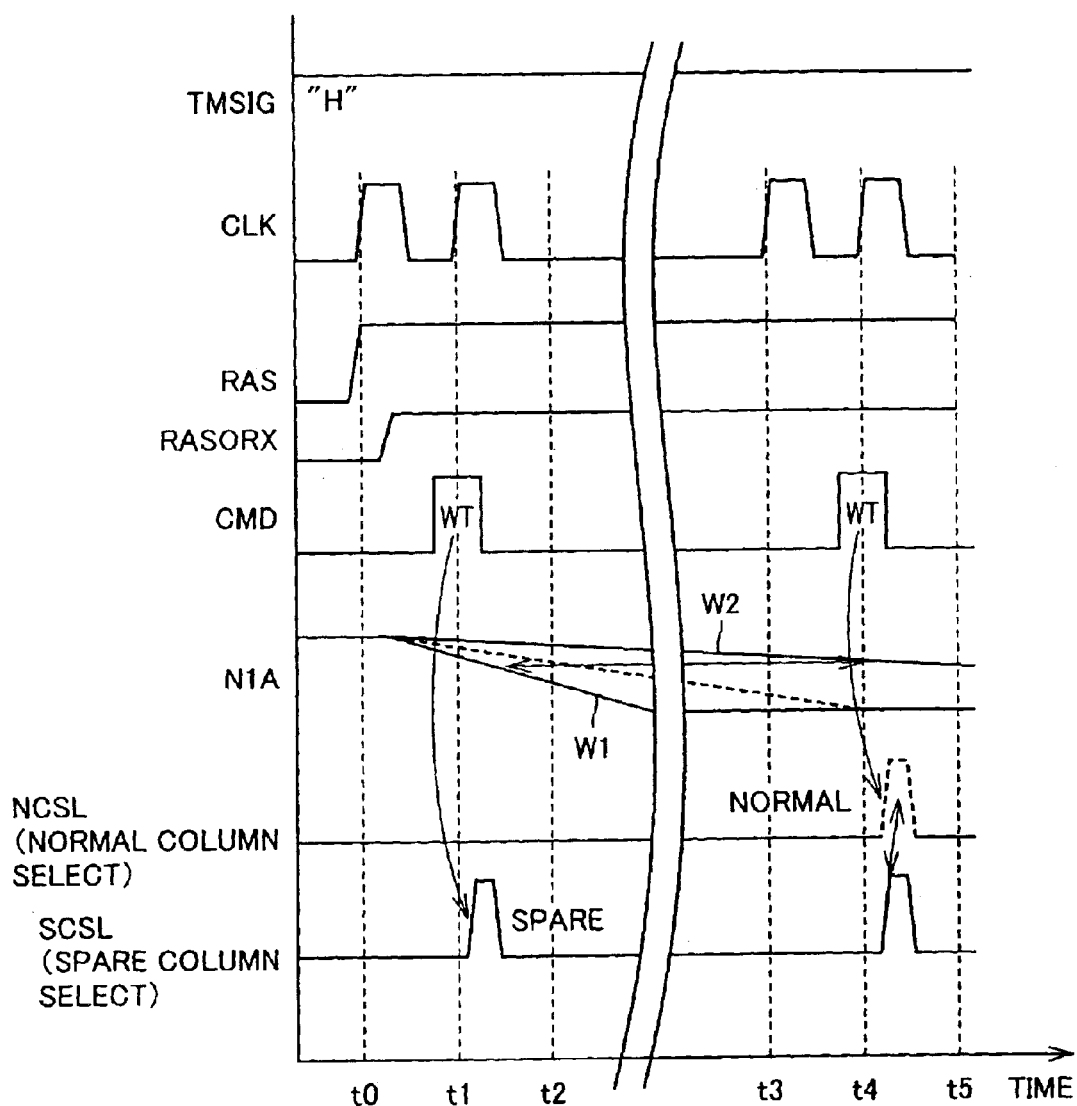
FIG. 10 is an operational waveform diagram illustrating an operation of the block program circuit shown in FIG. 9.

FIG. 10 is an operational waveform diagram illustrating an operation of the block program circuit shown in FIG. 9.

Referring to FIGS. 9 and 10, signal TMSIG is switched from L level to H level. Accordingly, in writing at time t4 where tRCD is long, the waveform of node N1A can be switched from W1 to W2. Thus, incorrect determination of the fuse state in the repair mode can be avoided.

Conversely, if P-channel MOS transistor 210 is designed to have drivability lower than P-channel MOS transistor 206, the waveform of node N1A can be switched from W2 to W1 by switching signal TMSIG from L level to H level in writing at time t4 where tRCD is long.

Here, though an example applied to the block program circuit generating signal SCL<0> has been described, a configuration in which drivers are switched may be applied to bit program circuits 71 to 77 in FIG. 3.

As described above, by permitting switch of the drivers in the latch circuit besides adding a driver, determination of a resistance value in the fuse blow portion can be switched in any direction. Thus, optimal adjustment of the driver size with an appropriate margin so as not to cause incorrect determination of fuse blow state can be attained.

(Embodiment 3)

Figure 11:
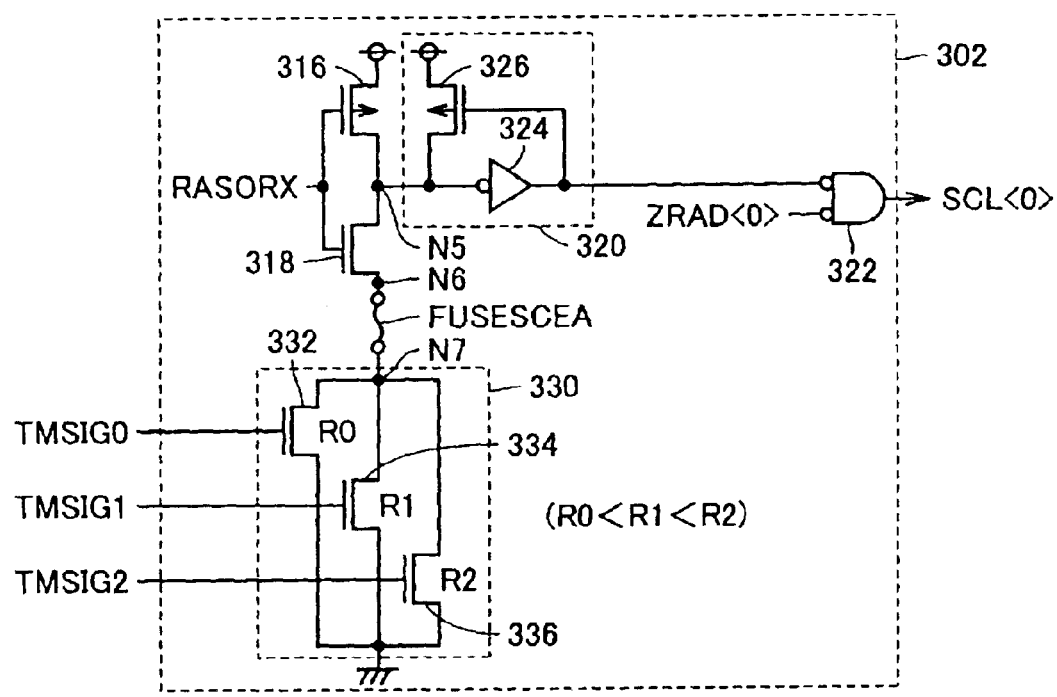
FIG. 11 is a circuit diagram showing a configuration of the block program circuit used in Embodiment 3.

FIG. 11 is a circuit diagram showing a configuration of the block program circuit used in Embodiment 3.

Referring to FIG. 11, a block program circuit 302 includes a P-channel MOS transistor 316 connected between the power supply node and a node N5 and receiving signal RASORX at its gate, an N-channel MOS transistor 318 connected between node N5 and a node N6 and receiving signal RASORX at its gate, a fuse element FUSESCEA connected between node N6 and a node N7, and a connection circuit 330 connecting node N7 to the ground node in response to signals TMSIG0 to TMSIG2.

Block program circuit 302 further includes a latch circuit 320 holding the potential of node N5, and an NOR circuit 322 receiving an output of latch circuit 320 and signal ZRAD<0> and outputting signal SCL<0>.

Connection circuit 330 includes N-channel transistors 332, 334, 336 connected in parallel between node N7 and the ground node. N-channel MOS transistor 332 receives signal TMSIG0 at its gate, and has a resistance value of R0 when rendered conductive. N-channel MOS transistor 334 receives signal TMSIG1 at its gate, and has a resistance value of R1 when rendered conductive. N-channel MOS transistor 336 receives signal TMSIG2 at its gate, and has a resistance value of R2 when rendered conductive. Here, a relation of R0<R1<R2 is established among resistance values R0 to R2.

With regard to the setting of signals TMSIG0 to TMSIG2, for example, in the normal operation mode, signal TMSIG1 is set to H level, while signals TMSIG0, TMSIG2 are set to L level. If signals TMSIG0 to TMSIG2 are activated in a different combination by selecting the operation mode, the degree of severity in determining the resistance value at the fuse blow portion can be adjusted.

For example, if signal TMSIG0 is activated and signals TMSIG1, TMSIG2 are inactivated, node N7 is connected to the ground node by N-channel MOS transistor 332 that has low resistance. Here, as the current flow in connection circuit 330 is larger than in the normal operation mode, node N5 is lowered to L level. Therefore, fuse blow can severely be checked.

In contrast, if signal TMSIG2 is activated and signals TMSIG0, TMSIG1 are inactivated, node N7 is connected to the ground node by N-channel MOS transistor 336 that has high resistance. In this case, the current flow in connection circuit 330 is smaller than in the normal operation mode. Therefore, fuse blow can loosely be checked.

As described above, by inserting the connection circuit for adjusting a current value between the fuse unit and the ground node, the degree of severity in determining fuse blow state when the fuse element is incompletely blown can be adjusted. Depending on a different combination of signals TMSIG0 to TMSIG2 to be activated, adjustment range can be expanded. For example, a plurality of signals out of signals TMSIG0 to TMSIG2 may be activated in a certain mode.

(Embodiment 4)

Figure 12:
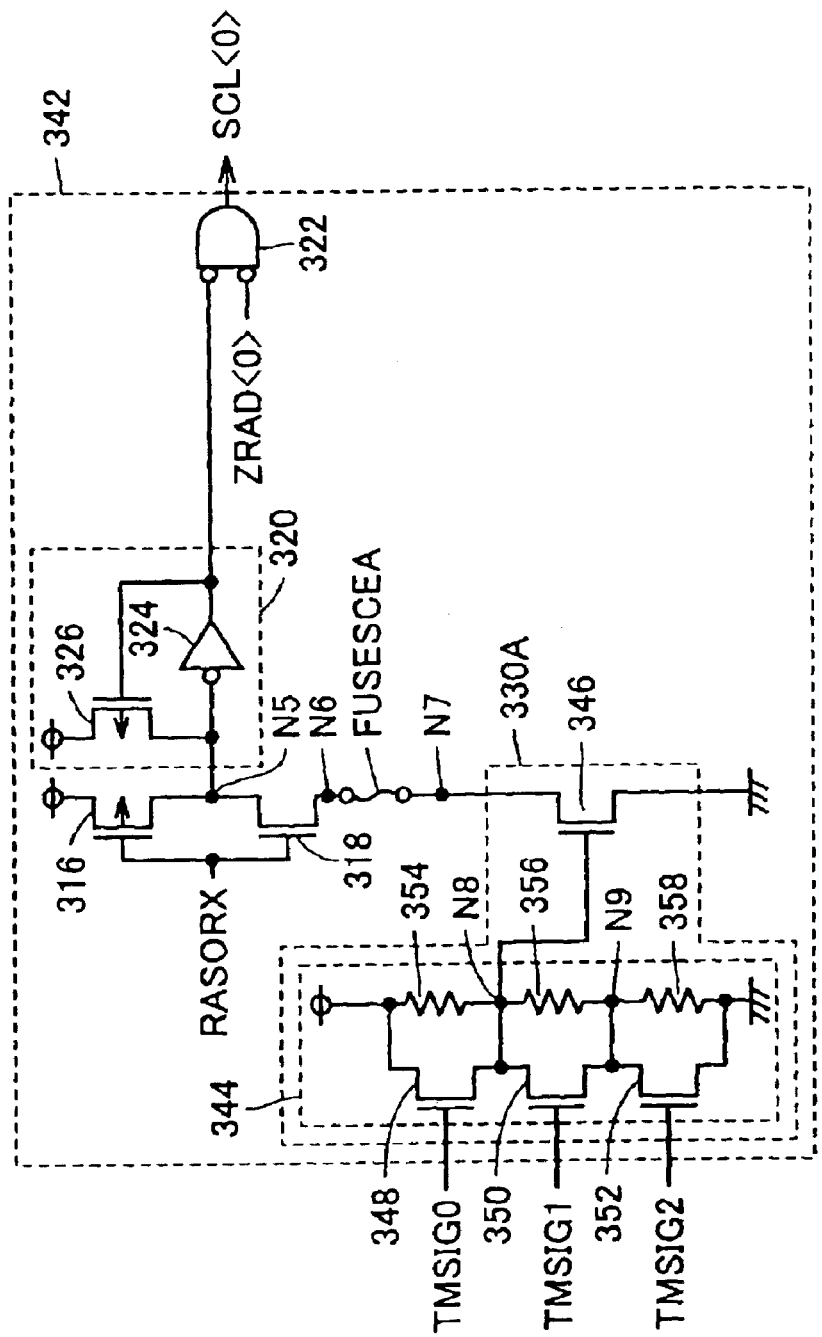
FIG. 12 is a circuit diagram showing a configuration of a block program circuit 342 used in Embodiment 4.

FIG. 12 is a circuit diagram showing a configuration of a block program circuit 342 used in Embodiment 4.

Referring to FIG. 12, block program circuit 342 includes a connection circuit 330A instead of connection circuit 330 in the configuration of block program circuit 302 described with reference to FIG. 11. As the configuration in block program circuit 342 is otherwise the same as that in block program circuit 302 described in FIG. 11, description thereof will not be repeated.

Connection circuit 330A includes a voltage generating circuit 344 outputting an intermediate voltage to a node N8, and an N-channel MOS transistor 346 connected between node N7 and the ground node and having the gate connected to node N8.

Voltage generating circuit 344 includes an N-channel MOS transistor 348 connected between the power supply node and node N8 and receiving signal TMSIG0 at its gate, an N-channel MOS transistor 350 connected between node N8 and a node N9 and receiving signal TMSIG1 at its gate, and an N-channel MOS transistor 352 connected between node N9 and the ground node and receiving signal TMSIG2 at its gate.

Voltage generating circuit 344 further includes a resistance element 354 connected between the power supply node and node N8, a resistance element 356 connected between node N8 and node N9, and a resistance element 358 connected between node N9 and the ground node.

In voltage generating circuit 344, by selectively rendering N-channel MOS transistors 348, 350, 352 conductive, the voltage-divided potential of node N8 can be changed. Thus, the gate potential of N-channel MOS transistor 346 can be controlled, and capability to drive node N5 to the ground potential can be adjusted.

For example, it is assumed that signals TMSIG0 to TMSIG2 are all inactivated to L level in the normal operation mode. Then, the intermediate voltage that has been voltage-divided by resistance elements 354 to 358 is applied to the gate of N-channel MOS transistor 346.

When signal TMSIG0 is activated and signals TMSIG1, TMSIG2 are inactivated, node N8 is connected to the power supply potential by N-channel MOS transistor 348. Here, as the current flow in N-channel MOS transistor 346 is large, node N5 is lowered to L level. Therefore, fuse blow can severely be checked.

In contrast, when signal TMSIG1 is activated and signals TMSIG0, TMSIG2 are inactivated, opposite ends of resistance element 356 are connected, a voltage-division ratio by the resistance element changes, and the intermediate potential of node N8 will be lower than in the normal operation mode. Here, the current flow in N-channel MOS transistor 346 is smaller than in the normal operation mode, and therefore, fuse blow can loosely be checked.

In the configuration shown in Embodiment 4 as well, an effect as in Embodiment 3 can be obtained.

(Embodiment 5)

The connection circuit for adjusting the current described in Embodiment 3 may be shared by a plurality of fuse circuit units.

Figure 13:
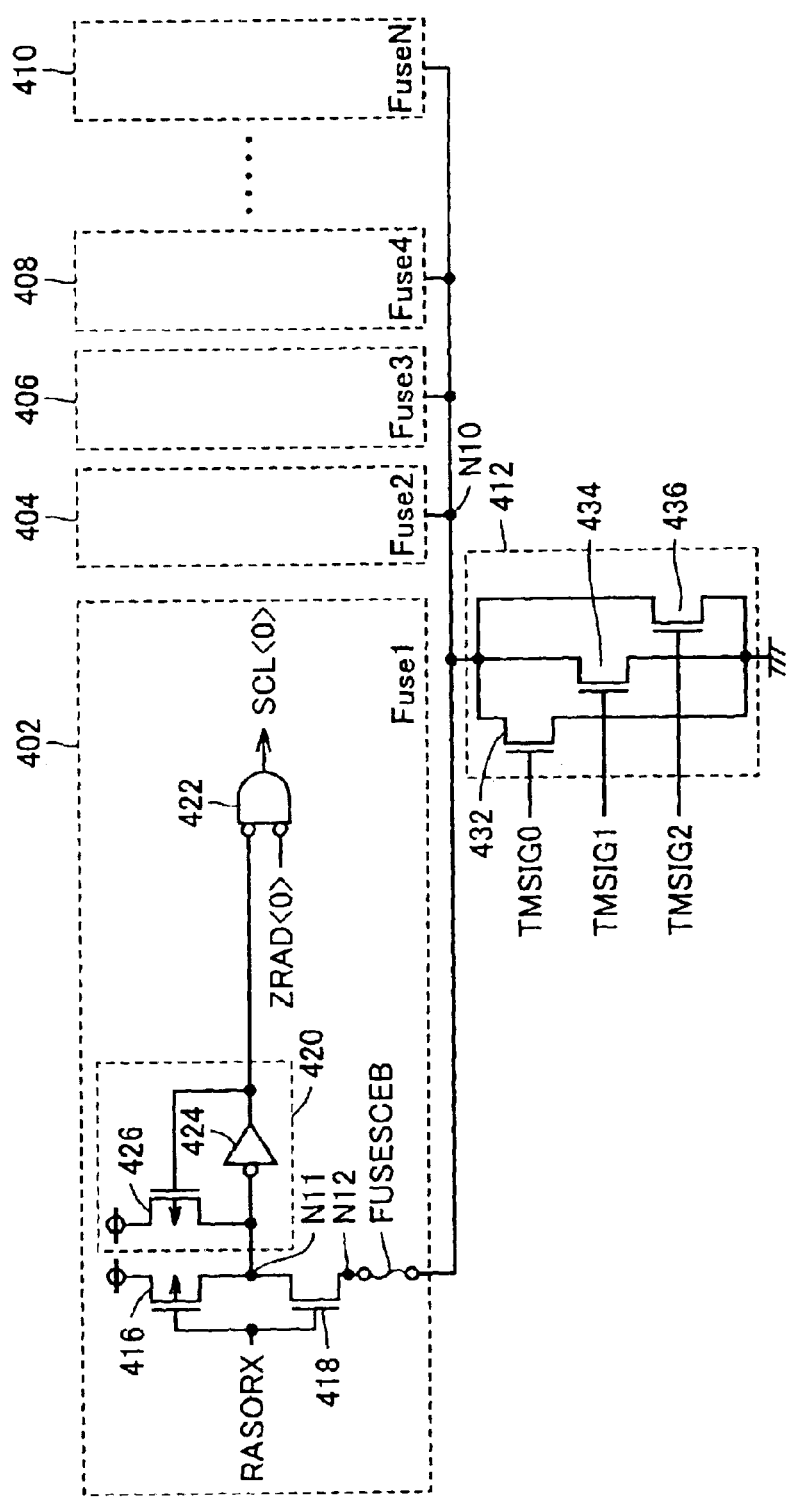
FIG. 13 is a circuit diagram showing a configuration of a fuse circuit unit in Embodiment 5.

FIG. 13 is a circuit diagram showing a configuration of the fuse circuit unit in Embodiment 5.

Referring to FIG. 13, fuse circuits 402, 404, 406, 408, 410 are connected to a common node N1. A connection circuit 412 is provided between node N10 and the ground node.

Connection circuit 412 includes N-channel transistors 432, 434, 436 connected in parallel between node N10 and the ground node. N-channel MOS transistor 432 receives signal TMSIG0 at its gate, and has a resistance value of R0 when rendered conductive. N-channel MOS transistor 434 receives signal TMSIG1 at its gate, and has a resistance value of R1 when rendered conductive. N-channel MOS transistor 436 receives signal TMSIG2 at its gate, and has a resistance value of R2 when rendered conductive. Here, a relation of R0<R1<R2 is established among resistance values R0 to R2.

Fuse circuit 402 includes a P-channel MOS transistor 416 connected between the power supply node and a node N11 and receiving signal RASORX at its gate, an N-channel MOS transistor 418 connected between node N11 and a node N12 and receiving signal RASORX at its gate, a fuse element FUSESCEB connected between node N12 and node N10, a latch circuit 420 latching the potential of node N11, and an NOR circuit 422 receiving an output of latch circuit 420 and signal ZRAD<0> and outputting signal SCL<0>. Latch circuit 420 includes an inverter 424 having an input connected to node N11, and a P-channel MOS transistor 426 connected between the power supply node and node N11 and receiving an output of inverter 424 at its gate.

Fuse circuit 402 includes a first fuse element. Fuse circuits 404, 406, 408, 410 include second, third, fourth, and Nth fuse elements respectively. Fuse elements FUSECA1 to FUSECA7 in FIG. 3, or a completely irrelevant fuse element may be employed as the fuse elements included in fuse circuits 404, 406, 408, 410.

With such a method, a redundant circuit can attain an overall, compact configuration.

(Embodiment 6)

Figure 14:
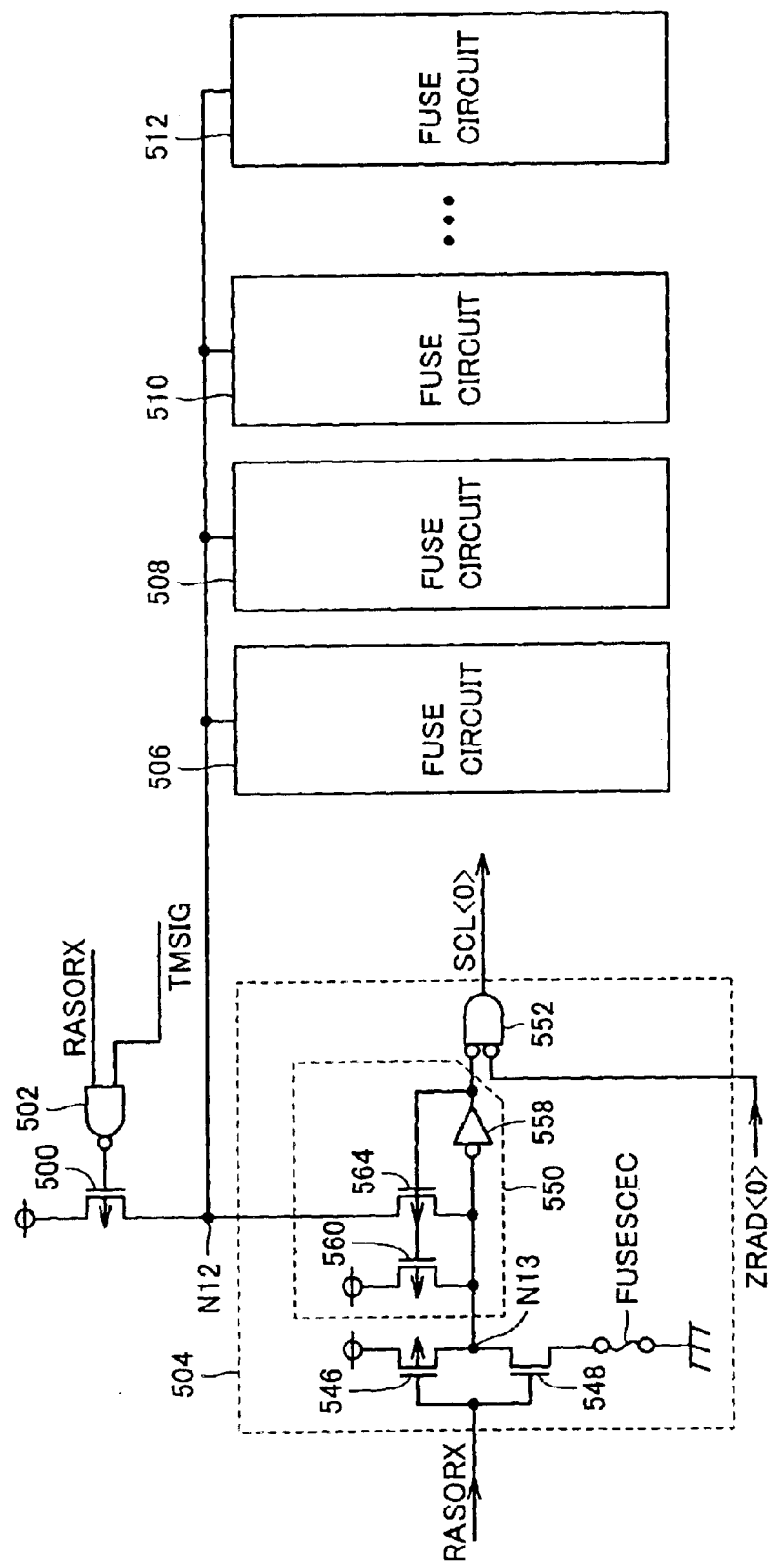
FIG. 14 is a circuit diagram showing a configuration of the fuse circuit unit used in Embodiment 6.

FIG. 14 is a circuit diagram showing a configuration of the fuse circuit unit used in Embodiment 6.

Referring to FIG. 14, the fuse circuit unit in Embodiment 6 includes an NAND circuit 502 receiving signals RASORX and TMSIG, a P-channel MOS transistor 500 connected between the power supply node and node N12 and receiving an output of NAND circuit 502 at its gate, and fuse circuits 504, 506, 508, 510, 512 commonly connected to node N12.

Fuse circuit 504 includes a P-channel MOS transistor 546 connected between the power supply node and a node N13 and receiving signal RASORX at its gate, a fuse element FUSESCEC having one end connected to the ground node, an N-channel MOS transistor 548 connected between the other end of fuse element FUSESCEC and node N13 and receiving signal RASORX at its gate, a latch circuit 550 latching the potential of node N13, and an NOR circuit 552 receiving an output of latch circuit 550 and signal ZRAD<0> and outputting signal SCL<0>. Latch circuit 550 includes a P-channel MOS transistor 560 connected between the power supply node and a node N13 and receiving an output of an inverter 558 at its gate, and a P-channel MOS transistor 564 connected between node N12 and node N13 and receiving the output of inverter 558 at its gate. The output of inverter 558 is provided to NOR circuit 552 as the output of latch circuit 550.

Fuse elements FUSECA1 to FUSECA7 in FIG. 3, or a completely irrelevant fuse element may be employed in fuse circuits 506 to 512.

With such a configuration as well, the overall redundant circuit can be made smaller.

(Embodiment 7)

The degree of severity in determining fuse blow state can be adjusted by varying duration of a determination period.

Figure 15:
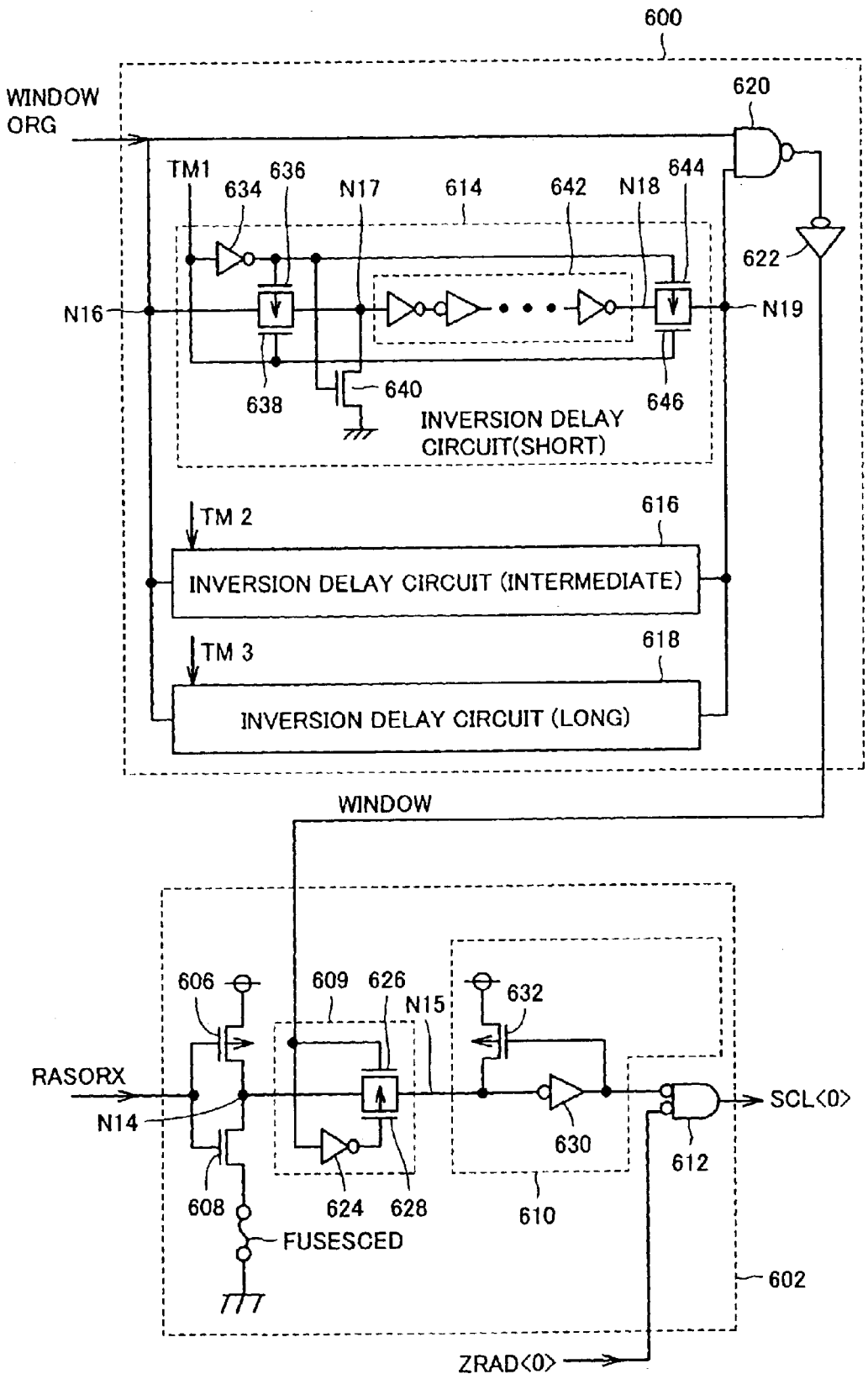
FIG. 15 is a circuit diagram showing a configuration of the fuse circuit unit used in Embodiment 7.

FIG. 15 is a circuit diagram showing a configuration of the fuse circuit unit used in Embodiment 7.

Referring to FIG. 15, the fuse circuit in Embodiment 7 includes a pulse generating circuit 600 varying a pulse width of a signal WINDOW indicating a determination period in response to control signals TM1 to TM3, and a fuse circuit 602 determining the fuse element blow state during a period indicated by signal WINDOW.

Fuse circuit 602 includes a P-channel MOS transistor 606 connected between the power supply node and a node N14 and receiving signal RASORX at its gate, a fuse element FUSESCED having one end connected to the ground node, and an N-channel MOS transistor 608 connected between the other end of fuse element FUSESCED and node N14 and receiving signal RASORX at its gate.

Fuse circuit 602 further includes a connection circuit 609 connecting node N14 to a node N15 in response to signal WINDOW, a latch circuit 610 latching the potential of node N15, and an NOR circuit 612 receiving an output of latch circuit 610 and signal ZRAD<0> and outputting signal SCL<0>.

Connection circuit 609 includes an inverter 624 receiving and inverting signal WINDOW, a P-channel MOS transistor 628 connected between node N14 and node N15 and receiving an output of inverter 624 at its gate, and an N-channel MOS transistor 626 connected between node N14 and node N15 and receiving signal WINDOW at its gate.

Latch circuit 610 includes an inverter 630 having an input connected to node N15, and a P-channel MOS transistor 632 connected between the power supply node and node N15 and receiving an output of inverter 630 at its gate.

Pulse generating circuit 600 includes an inversion delay circuit 614 activated in response to signal TM1, and inverting and delaying a signal WINDOW_ORG in a prescribed, short delay time period, to output the signal, an inversion delay circuit 616 activated in response to signal TM2, and inverting and delaying signal WINDOW_ORG in an inversion time period with an intermediate duration that is longer than that in inversion delay circuit 614, to output the signal, and an inversion delay circuit 618 activated in response to signal TM3, and inverting and delaying signal WINDOW_ORG in a delay time period with a duration further longer than that in inversion delay circuit 616, to output the signal.

Pulse generating circuit 600 further includes an NAND circuit 620, and an inverter 622 receiving and inverting an output of NAND circuit 620 and outputting signal WINDOW. Signal WINDOW_ORG is provided to one input of NAND circuit 620. The other input of NAND circuit 620 is connected to a node N19 to which outputs from inversion delay circuits 614, 616, 618 are all connected. Inputs of delay circuits 614, 616, 618 are all connected to a node N16, to which signal WINDOW_ORG is provided.

Inversion delay circuit 614 includes an inverter 634 receiving and inverting control signal TM1, a P-channel MOS transistor 636 connected between node N16 and a node N17 and receiving an output of inverter 634 at its gate, an N-channel MOS transistor 638 connected between node N16 and node N17 and receiving control signal TM1 at its gate, and an N-channel MOS transistor 640 connected between node N17 and the ground node and receiving the output of inverter 634 at its gate.

Inversion delay circuit 614 further includes an inverter chain 642 having an odd number of stages, which has an input of the first stage connected to node N17 and has an output of the last stage connected to a node N18, a P-channel MOS transistor 644 connected between node N18 and node N19 and receiving the output of inverter 634 at its gate, and an N-channel MOS transistor 646 connected between node N18 and node N19 and receiving control signal TM1 at its gate.

In inversion delay circuits 616, 618, control signals TM2, TM3 instead of control signal TM1 are provided respectively. In addition, length of inverter chain 642 is set such that length of the inversion delay circuits is increased in the order of inversion delay circuits 614, 616, 618. As the configuration of inversion delay circuits 616, 618 is otherwise the same as that of inversion delay circuit 614, description thereof will not be repeated.

Figure 16:
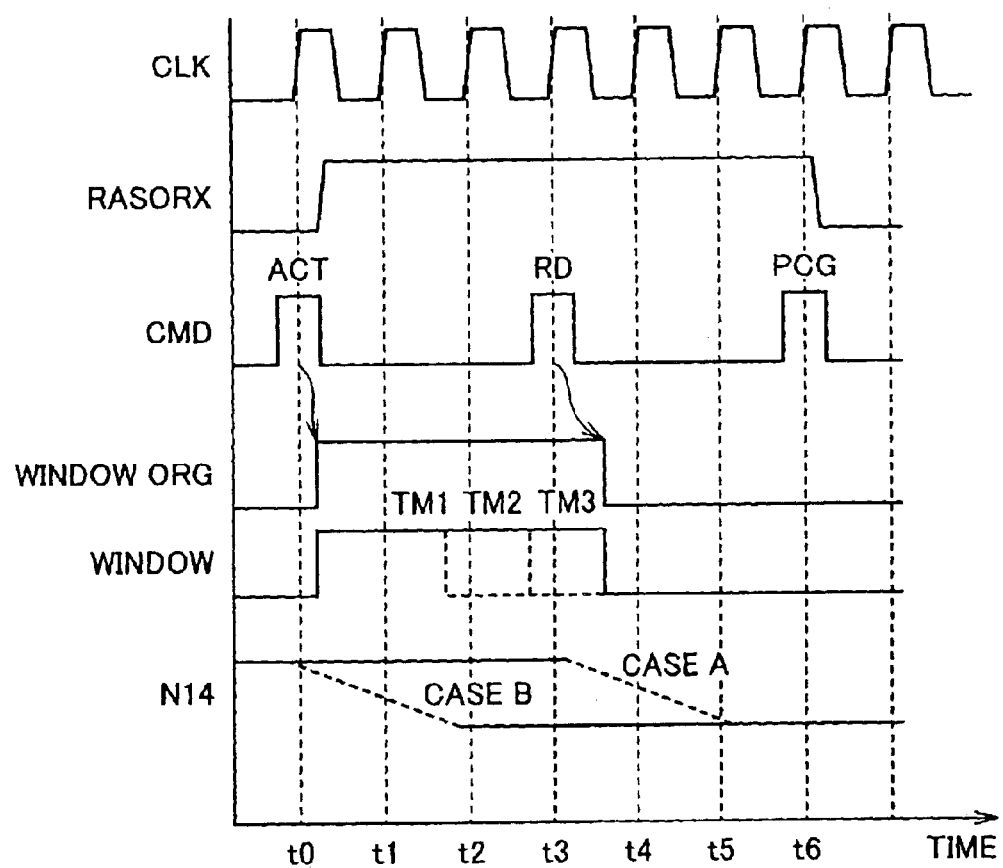
FIG. 16 is an operational waveform diagram illustrating an operation of the circuit shown in FIG. 15.

FIG. 16 is an operational waveform diagram illustrating an operation of the circuit shown in FIG. 15.

Referring to FIGS. 15 and 16, when command ACT is input at time t0, signal WINDOW_ORG accordingly rises. Depending on a delay time from the rise, the pulse width of signal WINDOW will differ respectively in cases when control signals TM1, TM2, TM3 are activated, as shown in the figure. Thus, a time period during which node N14 is connected to node N15 can be varied.

Even if a device is present, which has different timings for potential change of node N14 such as CASE A, CASE B, depending on the fuse blow state, the defect can be identified by controlling the window pulse width by means of control signals TM1 to TM3. Conversely, non-defective can be identified by means of control signal TM1.

Figure 17:
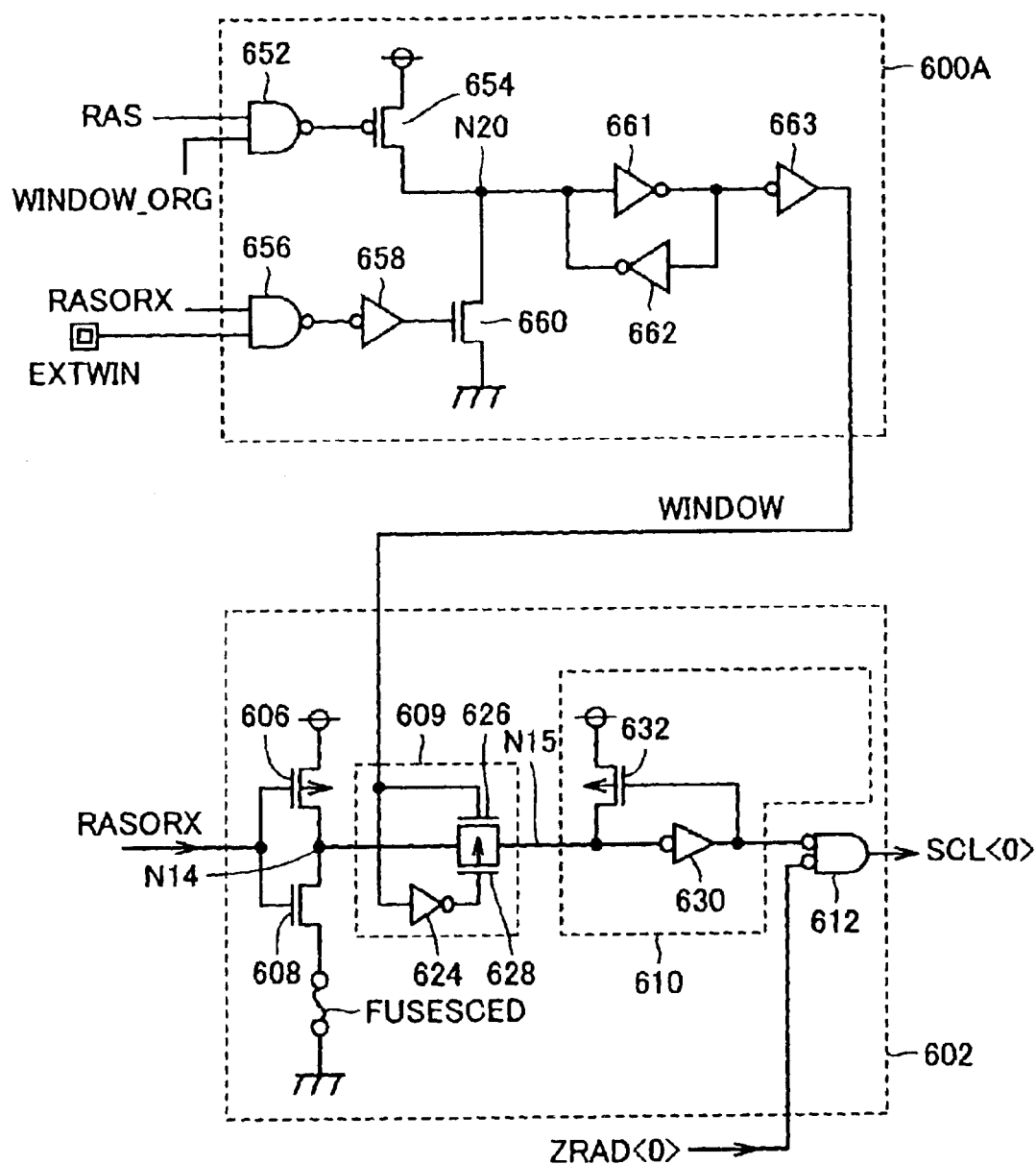
FIG. 17 is a circuit diagram showing a variation of the configuration shown in FIG. 15.

FIG. 17 is a circuit diagram showing a variation of the configuration shown in FIG. 15.

In FIG. 17, a pulse generating circuit 600A is provided instead of pulse generating circuit 600 in the configuration of FIG. 15. Pulse generating circuit 600A includes an NAND circuit 652 receiving signal WINDOW_ORG and a signal RAS, a P-channel MOS transistor 654 connected between the power supply node and a node N20 and receiving an output of NAND circuit 652 at its gate, an NAND circuit 656 receiving signal RASORX and a signal EXTWIN input from an external terminal, an inverter 658 receiving an output of NAND circuit 656, and an N-channel MOS transistor 660 connected between node N20 and the ground node and receiving an output of inverter 658.

Pulse generating circuit 600A further includes an inverter 661 having an input connected to node N20, an inverter 662 inverting an output of inverter 661 and outputting the same to node N20, and an inverter 663 inverting the output of inverter 661 and outputting signal WINDOW. Inverters 661, 662 form a latch circuit holding the potential of node N20.

Figure 18:
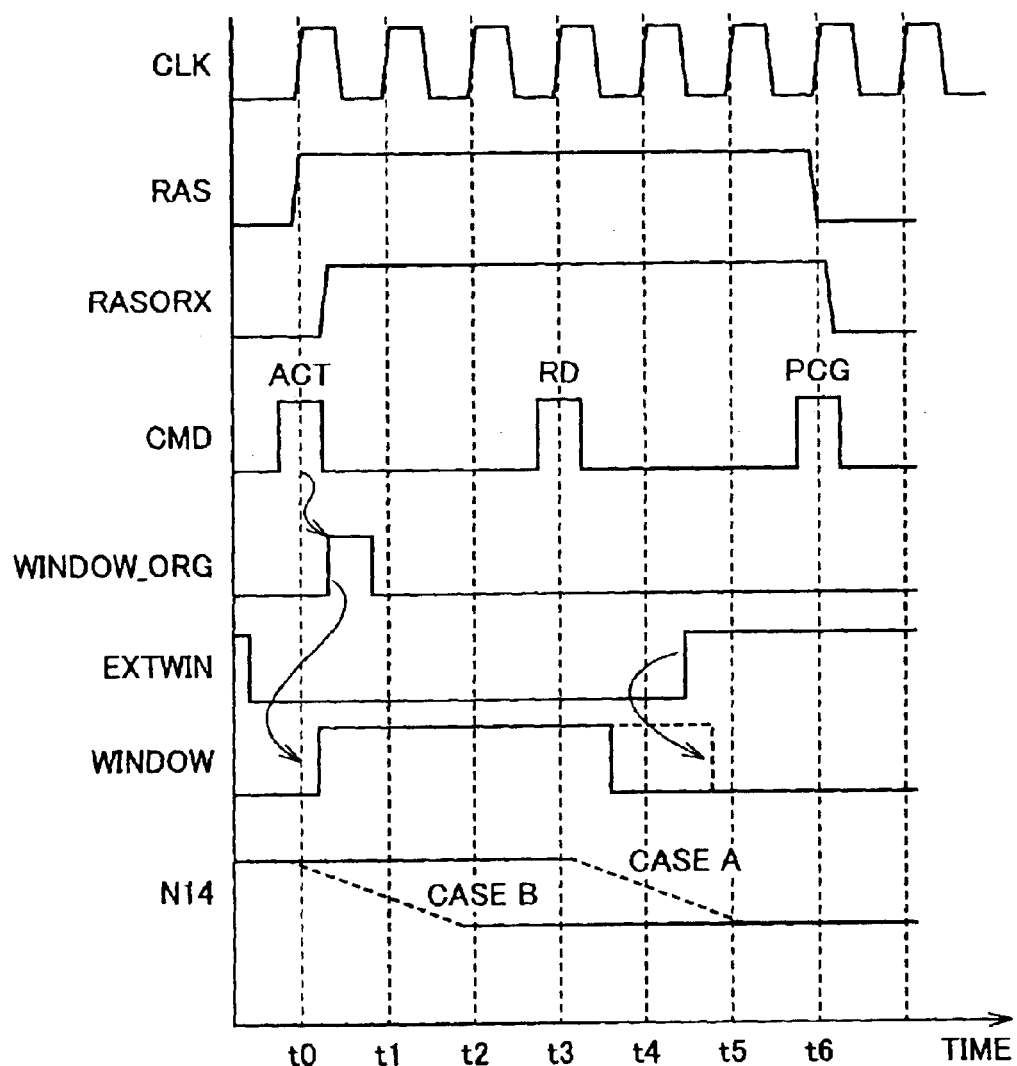
FIG. 18 is an operational waveform diagram illustrating an operation of the circuit shown in FIG. 17.

FIG. 18 is an operational waveform diagram illustrating an operation of the circuit shown in FIG. 17.

Referring to FIGS. 17 and 18, command ACT is input at time t0, and accordingly, signal WINDOW_ORG is activated in a pulsed manner. Signal EXTWIN provided from the external terminal is set to L level when command ACT is provided. In response to the rise of signal WINDOW_ORG, signal WINDOW is activated from L level to H level.

When signal EXTWIN rises from L level to H level at time t4–t5, signal WINDOW accordingly falls from H level to L level. By changing the timing of the rise of signal EXTWIN, a time period in which signal WINDOW is active can be controlled.

As described above, with the configuration shown in Embodiment 7 as well, the degree of severity in determining fuse blow state with respect to a case in which the fuse element is incompletely blown can be adjusted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a first connection circuit connecting a first internal node to a first power supply node provided with a first power supply potential in response to a first control signal;

a first fuse element provided on a path between a second power supply node provided with a second power supply potential which is different from said first power supply potential and said first internal node, and storing a conductive state in a non-volatile manner; and a first latch circuit holding a logic value corresponding to a potential of said first internal node; wherein said first latch circuit includes a first inverting circuit having an input connected to said first internal node, and a first driver circuit driving said first internal node to said first power supply potential in accordance with an output of said first inverting circuit, and said first driver circuit has a drivability variable in response to a second control signal.

2. The semiconductor device according to claim 1, wherein said first driver circuit includes a first field-effect transistor coupling said first internal node to said first power supply potential in accordance with the output of said first inverting circuit, and an additional connection circuit coupling said first internal node to said first power supply potential when said second control signal is activated and said first field-effect transistor is rendered conductive.

3. The semiconductor device according to claim 1, wherein said first driver circuit includes a first field-effect transistor selected in response to said second control signal, and coupling said first internal node to said first power supply potential in accordance with an output of said first inverting circuit, and a second field-effect transistor selected in a manner complementary to said first field-effect transistor in response to said second control signal, and coupling said first internal node to said first power supply potential in accordance with the output of said first inverting circuit.

4. The semiconductor device according to claim 1, further comprising:

a second connection circuit temporarily connecting a second internal node to said first power supply node;

a second fuse element provided on a path between said second power supply node and said second internal node, and storing the conductive state in a non-volatile manner;

a second latch circuit holding a logic value corresponding to a potential of said second internal node, said second latch circuit including a second inverting circuit having an input connected to said second internal node, and a second driver circuit driving said second internal node to said first power supply potential in accordance with an output of said second inverting circuit, said second driver circuit having a drivability variable in accordance with said second control signal; and a current supply circuit additionally supplying a driving current to said first and second driver circuits in response to said second control signal.

5. A semiconductor device, comprising:

a first connection circuit connecting a first internal node to a first power supply node provided with a first power supply potential in response to a first control signal;

a first latch circuit holding a logic value corresponding to a potential of said first internal node;

a first fuse element provided on a path between a second power supply node provided with a second power supply potential which is different from said first power supply potential and said first internal node, and storing a conductive state in a non-volatile manner; and a second connection circuit provided in series with said first fuse element between said first internal node and said second power supply node, and having a resistance value in a conductive state, variable in a plurality of steps in accordance with a second control signal.

6. The semiconductor device according to claim 5, wherein said second connection circuit includes a plurality of field-effect transistors connected to each other in parallel, and a gate of at least one of said plurality of field-effect transistors is controlled to attain a potential different from that of a gate of another one of said plurality of field-effect transistors, in response to said second control signal.

7. The semiconductor device according to claim 5, wherein said second connection circuit includes a voltage generating circuit having an output voltage variable in accordance with said second control signal, and a field-effect transistor receiving an output of said voltage generating circuit at a gate, and provided in series with said first fuse element between said first internal node and said second power supply node.

8. The semiconductor device according to claim 5, wherein said second connection circuit is connected between a second internal node and said second power supply node, and said semiconductor device further comprises a third connection circuit temporarily connecting a third internal node to said first power supply node, a second latch circuit holding a logic value corresponding to a potential of said third internal node, and a second fuse element provided on a path between said second internal node and said third internal node, and storing the conductive state in a non-volatile manner.

9. A semiconductor device, comprising:

a latch circuit holding a logic value corresponding to a potential of an input node which is initially set to a first power supply potential;

a fuse element provided on a path between a power supply node provided with a second power supply potential which is different from said first power supply potential and an internal node, and storing a conductive state in a non-volatile manner;

a connection circuit connecting said internal node to said input node during a period designated by a window pulse; and a pulse generating circuit varying a pulse width of said window pulse in accordance with a control signal.

10. The semiconductor device according to claim 9, further comprising a terminal to which said control signal is input.

* * * * *